(12) United States Patent
Oshima et al.

(10) Patent No.: US 7,764,216 B2
(45) Date of Patent: Jul. 27, 2010

(54) ANALOG-TO-DIGITAL CONVERTER, METHOD OF CONTROLLING THE SAME, AND WIRELESS TRANSCEIVER CIRCUIT

(75) Inventors: Takashi Oshima, Moriya (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 12/216,821

(22) Filed: Jul. 11, 2008

(65) Prior Publication Data

US 2009/0015455 A1 Jan. 15, 2009

(30) Foreign Application Priority Data

Jul. 11, 2007 (JP) ............... 2007-182305

(51) Int. Cl.
*H03M 1/12* (2006.01)
(52) U.S. Cl. ............ 341/172; 341/155; 341/161
(58) Field of Classification Search ......... 341/161, 341/172, 155
See application file for complete search history.

(56) References Cited

U.S. PATENT DOCUMENTS

| | | | |
|---|---|---|---|
| 5,006,854 A | | 4/1991 | White et al. |
| 6,570,411 B1 * | | 5/2003 | Bardsley et al. ............ 327/94 |
| 6,967,611 B2 * | | 11/2005 | Atriss et al. ............... 341/172 |
| 7,009,549 B1 * | | 3/2006 | Corsi .......................... 341/161 |
| 7,088,275 B2 * | | 8/2006 | Waltari ...................... 341/155 |
| 2004/0070917 A1 * | | 4/2004 | Michalski ................. 361/256 |
| 2005/0140537 A1 * | | 6/2005 | Waltari ...................... 341/162 |
| 2006/0220935 A1 * | | 10/2006 | Hughes et al. ............. 341/143 |
| 2007/0065432 A1 * | | 3/2007 | Xu et al. ................... 424/143.1 |

FOREIGN PATENT DOCUMENTS

| | | |
|---|---|---|
| JP | 03-206728 | 1/1990 |
| JP | 04-165822 | 10/1990 |
| JP | 05-235768 | 11/1991 |

OTHER PUBLICATIONS

Chiu, Yun et al., "Least Mean Square Adaptive Digital Background Calibration of Pipelined Analog-to-Digital Converters", IEEE Transactions on Circuits and Systems—I: Regular Papers, vol. 51, No. 1, Jan. 2004, pp. 38-46.

(Continued)

*Primary Examiner*—Jean B Jeanglaude
(74) *Attorney, Agent, or Firm*—Stites & Harbison PLLC; Juan Carlos A. Marquez, Esq.

(57) ABSTRACT

In an analog-to-digital converter, when a capacitive element with a small capacitance is used in order to reduce power consumption, the characteristics of the analog-to-digital converter deteriorate due to the variation in the specific accuracy. Further, the method of reducing the variation with the specific accuracy causes an increase in the size of the circuit and power consumption. An analog-to-digital converter includes an analog core unit having at least one capacitive element. The capacitive element includes a capacitive bank having plural capacitive element units having substantially the same capacitance value, and the capacitive bank is configured to select one capacitive element unit from the plural capacitive element units with substantially equal probability.

20 Claims, 18 Drawing Sheets

OTHER PUBLICATIONS

Oshima, Takashi et al., "Fast Digital Background Calibration for Pipelined A/D Converters", IEICE Technical Report VLD2006-138, ICD2006-229, Mar. 2007, pp. 115-120, in Japanese with English translation.

Shu, Yun-Shiang et al., "A 15b-Linear, 20MS/s, 1.5b/Stage Pipelined ADC Digitally Calibrated with Signal-Dependent Dithering", 2006 Symposium on VLSI Circuits Digest of Technical Papers.

* cited by examiner

US 7,764,216 B2

ANALOG-TO-DIGITAL CONVERTER, METHOD OF CONTROLLING THE SAME, AND WIRELESS TRANSCEIVER CIRCUIT

CLAIM OF PRIORITY

The present application claims priority from Japanese patent application JP 2007-182305 filed on Jul. 11, 2007, the content of which is hereby incorporated by reference into this application.

FIELD OF THE INVENTION

The present invention relates to an analog-to-digital converter, a method of controlling the same, and a wireless transceiver circuit, and in particular, to a circuit and a control method for improving the conversion accuracy of an analog-to-digital converter.

BACKGROUND OF THE INVENTION

As an example of an analog-to-digital converter according to the related art, a digital calibration pipelined of analog-to-digital converter is disclosed in "Least Mean Square Adaptive Digital Background Calibration of Pipelined Analog-to-Digital Converters" written by Y. Chiu et al., IEEE Transactions on Circuits and Systems I Vol. 51, pp. 38-46, 2004.

Further, the improvement of digital calibration type pipelined analog-to-digital converter in order to perform convergence of the calibration in the digital calibration type pipelined analog-to-digital converter at a higher speed according to the above "Least Mean Square Adaptive Digital Background Calibration of Pipelined Analog-to-Digital Converters" is disclosed in "Fast Digital Background Calibration for Pipelined A/D Converters" written by Takashi Oshima et al., The institute of Electronics, Information, and Communication Engineers, Technical Report of IEICE, VLD 2006-138, 2007.

As an example of the digital calibration type an analog-to-digital converter, in addition to the configuration disclosed in the above "Least Mean Square Adaptive Digital Background Calibration of Pipelined Analog-to-Digital Converters" and in the above "Fast Digital Background Calibration for Pipelined A/D Converters", a configuration that uses a pseudonoise signal without using a reference analog-to-digital converter is disclosed in "A 15 b-Linear, 20 MS/s, 1.5 b/Stage Pipelined ADC Digitally Calibrated with Signal-Dependent Dithering" (written by Y. S. Shu et al., 2006 Symposia on VLSI Technology and VLSI Circuits Session C25-1, 2006.

As an example of the related art, a successive approximation analog-to-digital converter that obtains a binary capacitance value that is used for a capacitive network by randomly selecting plural small unit capacitors, each having the equal capacitance value is disclosed in U.S. Pat. No. 5,006,854.

An example of the related art, an A/D converter that corrects an A/D conversion error caused by an error of a capacitance value of a capacitor array using a dummy capacitor arranged at the outside of a capacitor array is disclosed in JP-A-05(1993)-235768.

As another example of the related art, JP-A-04(1992)-165822 discloses an A/D converter in which a signal to be converted is input to a capacitor. The A/D converter includes a circuit that switches the input capacitor, and adjusts an amplitude level of the signal to be converted to output a low amplitude signal and a high amplitude signal with a constant resolution.

As still another example of the related art, a charge reallocation type AD converter that includes a correction unit only using some of capacitor arrays among the capacitor arrays is disclosed in JP-A-03(1991)-206728.

SUMMARY OF THE INVENTION

Recently, the importance of an analog-to-digital converter (hereinafter, simply referred to as ADC) becomes more significant as the development in the digitalization of LSI increased due to the miniaturization of a CMOS process.

In general, the current wireless system tends to make any one of a sample rate and a resolution of an ADC higher in consideration of power consumption. However, in order to realize a wireless system that has a high throughput and is tolerant to interference by a disturbing wave, such as next-generation wireless LAN, a technology that realizes an ADC with a high sample rate (several hundreds of MS/s to 1 GS/s) and a high resolution (10 to 12 b) at a low power consumption (several hundreds of mW or less) is required. However, the above technology is not adopted in the related art due to the power consumption. Further, the digital calibration ADC uses a capacitive element of several hundreds of fF or less in order to reduce the amount of consumed current, which causes variation in a specific accuracy of a capacitance and lowers an effective resolution ENOB, and linearity DNL/INL.

The configuration of a multiplying digital to analog converter MDAC in a sample mode and an amp mode that is used for a digital calibration type analog-to-digital converter disclosed in the above "Fast Digital Background Calibration for Pipelined A/D Converters" is shown in FIGS. 15 and 16. The MDAC refers to a multiplying digital to analog converter that outputs an analog value obtained by multiplying an input digital value and a reference value. The MDAC according to the related art has a basic configuration in which an op-amp 1101 is negatively fed back by a first capacitor $C_{10}$ 1102, a second capacitor $C_{20}$ 1103, and a third capacitor $C_{30}$ 1110. The connection is changed by switches 1104, 1105, 1106, 1107, 1108, 1111, and 1113 to be switched between two modes. Reference numeral 1109 refers to a DAC switch control unit, and the reference numeral 1112 refers to a CAL DAC switch control unit.

As shown in FIG. 15, in the sample mode, the first capacitor $C_{10}$ 1102 and the second capacitor $C_{20}$ 1103 are connected between an input analog voltage $V_{in}$ and a reference DC voltage. Charges, which are proportional to the input analog voltage $V_{in}$, are charged on the first capacitor $C_{10}$ 1102 and the second capacitor $C_{20}$ 1103. Further, since both terminals of the third capacitor $C_{30}$ 1110 are connected the reference DC voltage, the charge of the third capacitor $C_{30}$ 1110 is set to 0.

However, as shown in FIG. 16, in the amp mode, the op-amp 1101 is negatively fed back. Further, in the sample mode, the charges charged on the first capacitor $C_{10}$ 1102 are transferred onto the second capacitor $C_{20}$ 1103. Therefore, in the amp mode, the input analog voltage $V_{in}$ in the sample mode is output two times as much. Simultaneously, in response to a $DAC_{ctrl}$ signal that is generated on the basis of a rough quantization performed by a comparator array (not shown in FIG. 16)), the DAC switch control unit 1109 turns on any one of the switches 1108 when $Phi_2$ is active, that is, in the amp mode.

A calibration clock signal CAL takes any one value of +1, -1, and 0, and further, a value of $V_{ref}/16$, $-V_{ref}/16$, or 0 is subtracted from a voltage that is obtained by doubling a quantization error. The quantization error is a subtraction of the analog input voltage $V_{in}$ in the sample mode from the rough quantization result.

When the MDAC output voltage is intentionally changed by the calibration clock signal CAL, it is possible to shorten the digital calibration convergence. In this case, in order to avoid the saturation of the output voltage of the op-amp 1101, because a value that is sufficiently smaller than 1 is selected as α, the capacitance of the third capacitor $C_{30}$ 1110 needs to have very small value.

However, in case of an analog-to-digital converter mounted with an op-amp, such as the pipelined analog-to-digital converter, or an algorithm analog-to-digital converter, and an analog-to-digital converter mounted with a comparator, such as a successive approximation analog-to-digital converter, as capacitance values used in a circuit becomes larger, the power consumption of the op-amp or comparator becomes larger. Therefore, it is preferable to use capacitors having very small capacitances.

However, when the capacitive element having a small capacitance value is realized on a chip, the variation in the specific accuracy of the capacitance value exists, and the effective resolution and the linearity are lowered. Therefore, according to the related art, the use of the very small capacitance value in an analog-to-digital converter is avoided. As a result, the analog-to-digital converter according to the related art inevitably adopts a capacitance value larger than a capacitance value determined by the limitation of the thermal noise, that is, a kT/C noise. Therefore, the amount of consumed power is excessively increased.

The above tendency exists in the digital calibration type analog-to-digital converter which requires a capacitance smaller than that of the common analog-to-digital converter.

Especially, in the next generation wireless system such as a 302.11n wireless LAN system, a post 302.11n wireless LAN system, a fourth generation portable phone system, it is required to realize an analog-to-digital converter, which has a high sample rate of several hundreds of MS/s or more and high resolution of 10 bit or more, at the low power consumption. Further, a digital calibration type analog-to-digital converter is expected to be used as the above-described analog-to-digital converter. Therefore, the variation in the specific accuracy of capacitance may cause more problems in the future.

The digital calibration type analog-to-digital converter disclosed in the above "A 15 b-Linear, 20 MS/s, 1.5 b/Stage Pipelined ADC Digitally Calibrated with Signal-Dependent Dithering" has the configuration of the MDAC shown in FIGS. 15 and 16, which needs to have small capacitance.

However, any of the inventions disclosed in the above "Least Mean Square Adaptive Digital Background Calibration of Pipelined Analog-to-Digital Converters", "Fast Digital Background Calibration for Pipelined A/D Converters", "A 15 b-Linear, 20 MS/s, 1.5 b/Stage Pipelined ADC Digitally Calibrated with Signal-Dependent Dithering", and JP-A-04(1992)-165822 does not suggest the solution of the problems in terms of the variation in the specific accuracy of capacitance.

In contrast, the above U.S. Pat. No. 5,006,854 discloses a method of preventing variation in the specific accuracy of capacitance value. According to the related art disclosed in U.S. Pat. No. 5,006,854, 11 unit capacitive elements are randomly selected from 15 unit capacitive elements Cu. For example, when there is variation in the specific accuracy of capacitance of a capacitive element C, a conversion error regularly occurs whenever the capacitive element is selected, which deteriorates the linearity of an analog-to-digital converter. However, when the capacitive element is randomly selected from the unit capacitive elements Cu, the errors of the capacitive elements may be averaged, and the error of the capacitive elements may be changed into a noise, not the regular conversion error. Therefore, the changed noise can be removed, which allows high resolution to be realized.

The method disclosed in U.S. Pat. No. 5,006,854 has the same conception as "Dynamic Element Matching", which is conventionally used to improve the linearity of a digital-to-analog converter. For example, in order to realize binary capacitance values of C, 2C, 4C, and 8C, 15 unit capacitive elements Cu having capacitance values C are prepared. When the binary values are used to realize the value of 11C, since C+2C+8C make 11C, C, 2C, and 8C are simultaneously selected by switches. However, according to the above method, required number of elements needs to be simultaneously selected from an array of the unit capacitive elements Cu and the entire capacitive elements used in a circuit. Therefore, there is a problem in that the circuit configuration of a switch group that selects the capacitive elements and a method of selecting the same may be complicated. Further, the parasitic capacitance that is caused by the switches becomes larger. The power consumption of a comparator of a successive approximation analog-to-digital converter or an op-amp of a pipelined analog-to-digital converter increases. Furthermore, since the capacitive elements are randomly selected from the unit capacitive elements Cu, a random number generating circuit is required, which increases the size of the circuit and the power consumption.

That is, according to the method of reducing the variation of the specific accuracy of capacitance based on "Dynamic Element Matching" disclosed in U.S. Pat. No. 5,006,854, the method of selecting capacitive elements is complicated, which causes the increase in the size of the circuit and the power consumption.

In the meantime, the above JP-A-05(1993)-235768 discloses an A/D converter that corrects an A/D conversion error caused by an error of a capacitance value of a capacitor array using a dummy capacitor arranged at the outside of a capacitor array.

Further, the above JP-A-03(1991)-206728 discloses a charge reallocation type AD converter that includes a correction unit only using some of capacitor arrays among capacitor arrays. The AD converter performs the correction using a capacitor array that is configured by overlapping C, 2C, 4C, 8C, 16C, and 32C as a unit capacitor.

However, neither JP-A-05(1993)-235768 nor JP-A-03(1991)-206728 discloses the solution in terms of the variation in the specific accuracy, which is caused when capacitive elements having a small capacitance value are used to reduce the power consumption.

Therefore, the main problem to be solved by the present invention is to reduce the effect of the variation in the specific accuracy of the analog-to-digital converter, which is caused when the small capacitance is used in order to reduce the power consumption, by using a simple circuit configuration and a method thereof.

Hereinafter, an exemplary embodiment of the present invention will be described. An analog-to-digital converter according to the exemplary embodiment of the present invention includes an analog core unit having at least one capacitive element. The capacitive element includes a capacitive bank having plural capacitive element units having substantially the same capacitance value, and the capacitive bank is configured to select one capacitive element unit from the plural capacitive element units with substantially equal probability.

According to the exemplary embodiment of the present invention, it is possible to reduce the influence of the variation of the specific accuracy of the capacitive elements having small capacitance in the analog-to-digital converter with the simple configuration without increasing the power consumption.

DETAILED DESCRIPTION OF THE PREFERRED EMBODIMENTS

According to the exemplary embodiment of the present invention, at least one capacitor of an analog-to-digital converter is configured by a capacitive bank including plural capacitive element units having substantially the same capacitance value. Only one capacitive element unit to be used is randomly or periodically, exclusively or equally selected from the capacitive bank for every operating clock or in synchronization with an operating clock. Therefore, it is possible to reduce the non-linearity due to the variation of the specific accuracy of capacitance. Further, the capacitive element units that are not selected are non-active.

The exemplary embodiment is applied to an analog-to-digital converter that requires high sampling rate, high resolution, and low power consumption, such as, a pipelined analog-to-digital converter, a successive approximation analog-to-digital converter, or a digital calibration type analog-to-digital converter.

Further, in consideration of the effect of the present invention, that is, in terms of reducing the influence of the variation in the specific accuracy, the capacitor to which the capacitive bank is applied preferably has a small capacitance, for example, several hundreds of fF or less. If plural capacitive elements having different capacitance values are included in the circuit, it is effective to use the capacitive element having small capacitance value.

Hereinafter, exemplary embodiments of the present invention will be described in detail with reference to the accompanying drawings.

First Embodiment

Figure 1:
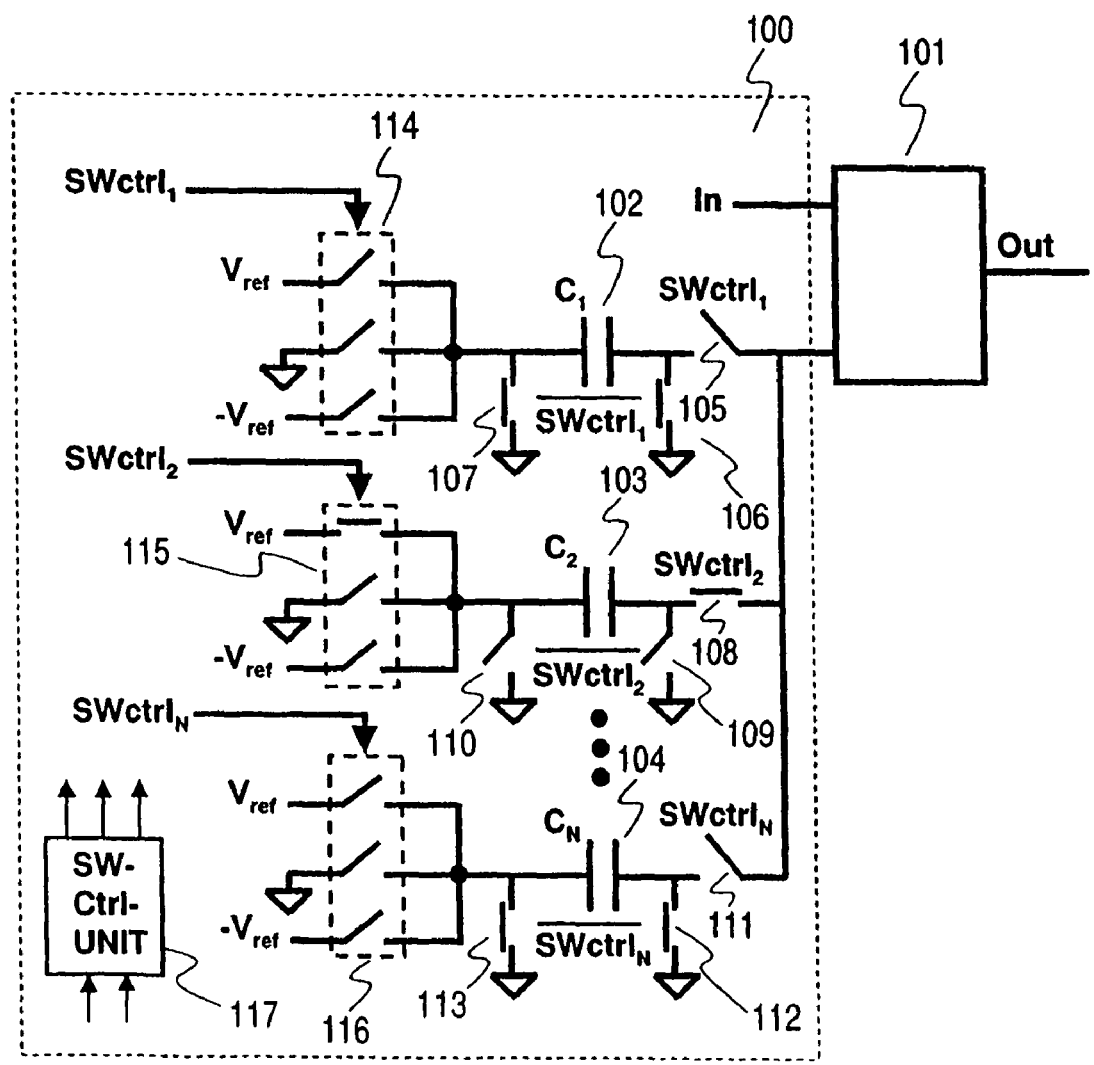
FIG. 1 is a diagram showing a configuration example of an MDAC circuit according to a first embodiment of the present invention.
Figure 2:
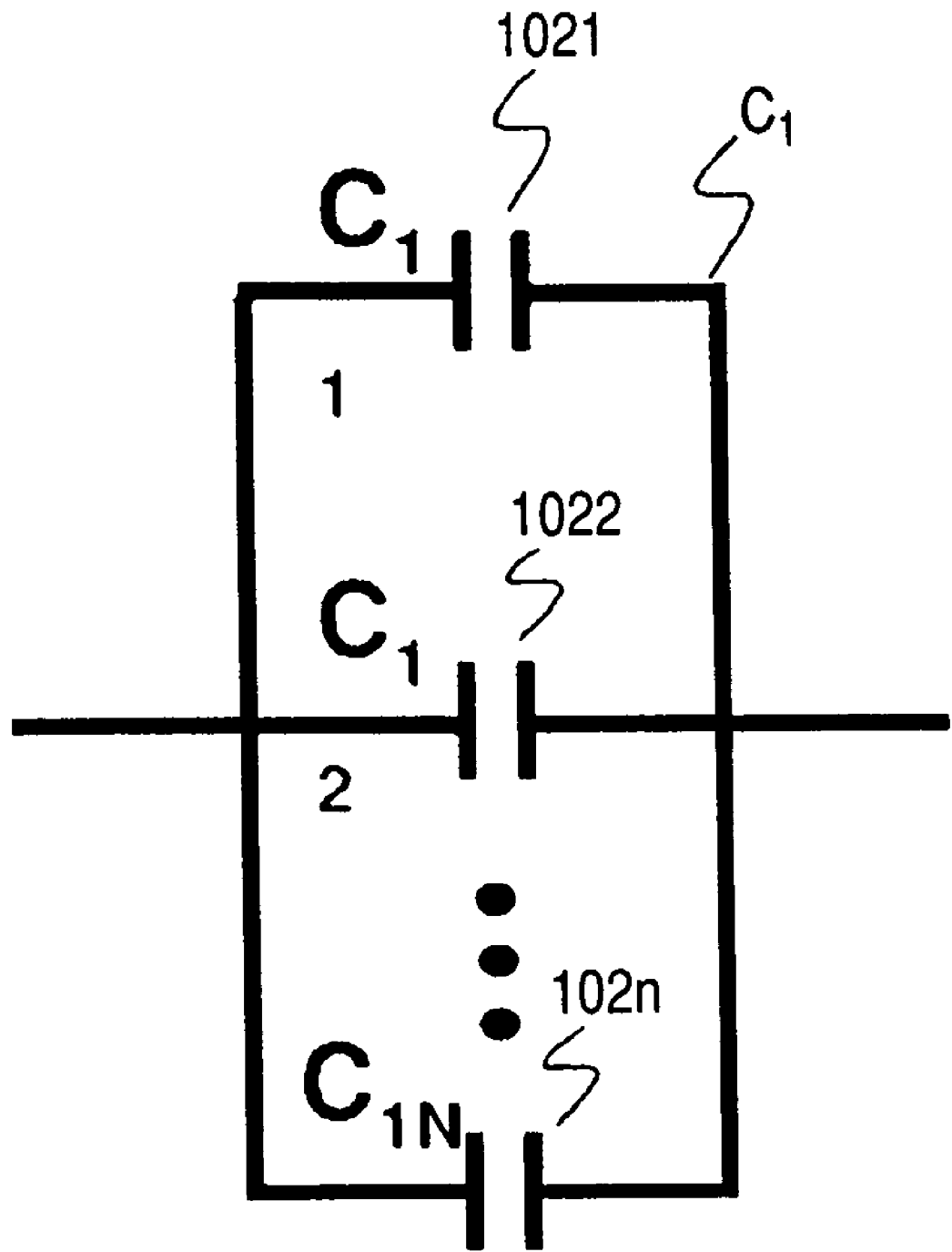
FIG. 2 is a diagram showing a configuration example of a capacitive element unit according to the present invention.

A first embodiment of the present invention will be described with reference to FIGS. 1 to 3. FIG. 1 is a diagram showing a configuration example of an MDAC circuit according to a first embodiment of the invention. In FIG. 1, reference numeral 100 refers to a capacitive bank, and reference numeral 101 refers to an analog core unit. Even though the analog core unit 101 is supposed to be each stage of MDAC in case of a pipelined analog-to-digital converter, and a capacitive network in case of a successive approximation analog-to-digital converter, the analog core unit 101 may be defined in reference the above as examples for another types of analog-to-digital converter.

The capacitive bank 100 realizes a small capacitance value that is required for the analog core unit 101 by using an array of a plurality (N) of capacitive element units $C_1$ to $C_N$, instead of using a single capacitive element C. That is, a specific capacitive element unit is selected from the capacitive bank, which is configured by the array of the plurality (N) of capacitive element unit $C_1$ to $C_N$, by a group of switches and a switch group control unit with a substantially equal probability. In this case, the array of the plural the capacitive element units has substantially the same capacitance, for example, the same capacitance as a designed value. Therefore, it is possible to realize a capacitance that corresponds to the single capacitive element C required for the analog core unit 101.

For this reason, the capacitive bank 100 includes a plurality (N) of capacitive element unit array $C_1$ to $C_N$, N element switches 106 to 113 in which each pair of switches are connected at both terminals of each capacitive element unit, and a switch group control unit 117 that controls the element switches to be turned on or off on the basis of a switch control signal $SWctr_1$. The switch group control unit 117 generates the switch control signal $SWctr_1$ or an inversion signal thereof that controls the element switch array using an operation clock signal as an input so that the capacitive element units of the array of the capacitive element units $C_1$ to $C_N$ are selected with substantially equal probability for the operating status of the analog-to-digital converter. Further, the switch group control unit 117 makes the frequencies when each of the element switches corresponding to each capacitive element unit is turned on substantially equal.

One capacitive element unit $C_1$ 102 that configures the capacitive bank 100 is connected to the analog core unit 101 through a switch 105, and connected to an appropriate node, such as a reference voltage or an input analog unit, through a switch 114. Further, referring to FIG. 1, the capacitive element unit $C_1$ 102 is connected to any one of reference voltage $+V_{ref}$, 0 (ground voltage), and $-V_{ref}$ corresponding to the amp mode status of the pipelined analog-to-digital converter. However, this invention is not limited thereto. The capacitive element unit $C_1$ 102 is also connected to a ground voltage through the switches 106 and 107.

Here, the switches 105 and 114 are controlled by a switch control signal $SWctrl_1$ and the switches 106 and 107 are controlled by an inversion signal of the switch control signal $SWctrl_1$.

A capacitive element unit $C_2$ 103, which has substantially the same capacitance value as the capacitive element unit $C_1$ 102, is connected to the analog core unit 101 through the switch 108, and is also connected to the reference voltage through the switch 115. Further, the capacitive element unit $C_3$ 103 is connected to a ground voltage through the switches 109 and 110. In this case, the switches 108 and 115 are controlled by a switch control signal $SWctrl_2$, the switches 109 and 110 are controlled by the inversion signal of the switch control signal $SWctrl_2$. Similarly, the capacitive element unit $C_N$ 104 is connected to the analog core unit 101 through the switch 111, and connected to the reference voltage through the switch 116.

Similarly, the capacitive element unit $C_N$ 104, which has substantially the same capacitance value as the capacitive element unit $C_1$ 102, is connected to the ground voltage through the switches 112 and 113. In this case, the switches 111 and 116 are controlled by a switch control signal $SWctrl_N$, the switches 112 and 113 are controlled by the inversion signal of the switch control signal $SWctrl_N$.

In FIG. 1, when the capacitive element unit $C_1$ 102 is selected, the switch control signal $SWctrl_1$ is active, which turns on the switch 105 and only a switch that is connected to any one of $+V_{ref}$, 0 (ground voltage), and $-V_{ref}$, among the switches 114. In this case, the switches 106 and 17 are turned off. Further, when the capacitive element unit $C_1$ 102 is selected, the signals other than the switch control signal $SWctrl_1$ are non-active. When the switch control signal $SWctrl_2$ is non-active, the switches 108 and 115 are turned off. Further, in this case, since the inversion signal of the switch control signal $SWctrl_2$ is active, the switches 109 and 111 are turned on. As a result, since both terminals of the capacitive element unit $C_2$ 103 are connected to the ground voltage, the capacitive element unit $C_2$ 103 becomes a deselecting status (non-operating status). Similarly, capacitive element units other than the capacitive element unit $C_1$ 102 become non-operating status. Further, the above is an example of a selection circuit of a capacitive element unit, and another kind of selection circuit may also be used.

Further, in this embodiment, the array of the plural capacitive element units $C_1$ to $C_N$ that configures the capacitive bank 100, each capacitive element units having substantially the same capacitance, may be configured by a single capacitive element unit. Otherwise, as shown in FIG. 2, the array of the capacitive element units may be configured by plural capacitive element units that have substantially the same capacitance. According to the example shown in FIG. 2, three capacitive elements having one third of a capacitance of the single capacitive element unit (totally, the same capacitance) are connected in parallel so as to be configured to have substantially the same capacitance as the capacitance of the single capacitive element unit. Further, in the embodiment described below, the capacitive element unit that configures the capacitive bank 100 may by configured by a single capacitive element or plural capacitive elements.

Figure 3:
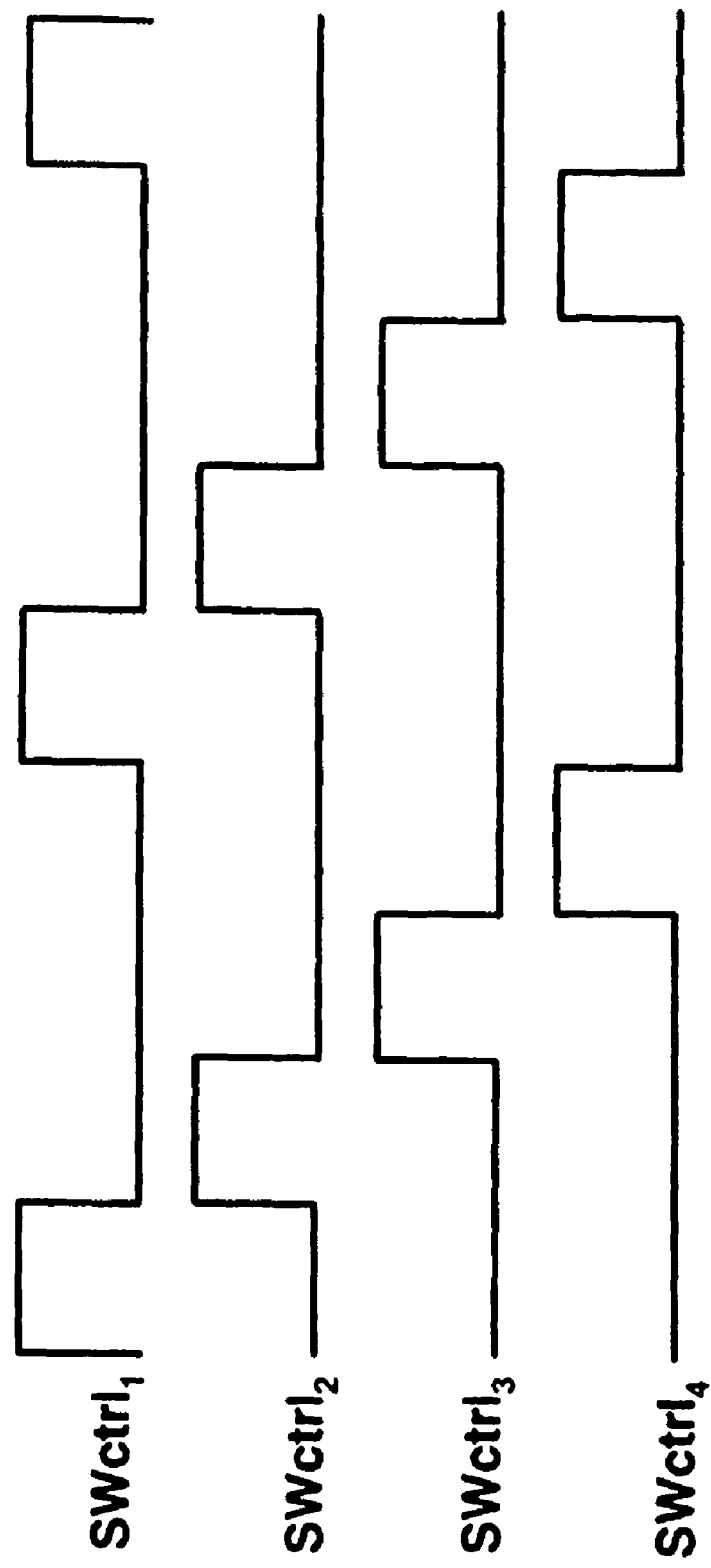
FIG. 3 is a diagram illustrating an operation timing according to the first embodiment.

FIG. 3 shows a selection method of each capacitive element unit by using the switch group control unit 117 according to the first embodiment, that is, an example of a method of generating the switch control signals $SWctrl_1$ to $SWctrl_N$ shown in FIG. 1. According to the first embodiment, in order to alternatively select only one of capacitive element units, only one of the switch control signals $SWctrl_1$ to $SWctrl_N$ is active, but two or more switch control signals SWctrl are not simultaneously active. Further, in order to reduce the influence of the variation of the capacitive element units as much as possible, the capacitive element units need to be selected with the substantially equal possibility. Therefore, the frequencies when the switch control signals SWctrl are active become substantially equal.

For example, as shown in FIG. 3 (N=4), in order to periodically select each of the capacitive element units, as the switch control signal SWctrl, periodic signals whose ON timings are staggered from each other may be selected. Further, the switch control signal SWctrl may be generated so as to randomly select only one of the capacitive element units. As long as only one of the capacitive element units is substantially selected with the substantially equal possibility, any other selections may be allowed.

According to the first embodiment, the capacitive elements in the analog-to-digital converter circuit may be realized with the simple configuration that only one of capacitive element units are selected from the capacitive bank configured by the plural capacitive element units having substantially the same capacitance value, with the substantially equal possibility. Therefore, it is possible to reduce the influence of the variation of the specific accuracy of the capacitive elements without increasing the power consumption. As a result, capacitive elements having a small capacitance may be used, which reduces the power consumption of the analog-to-digital converter.

Second Embodiment

Figure 4:
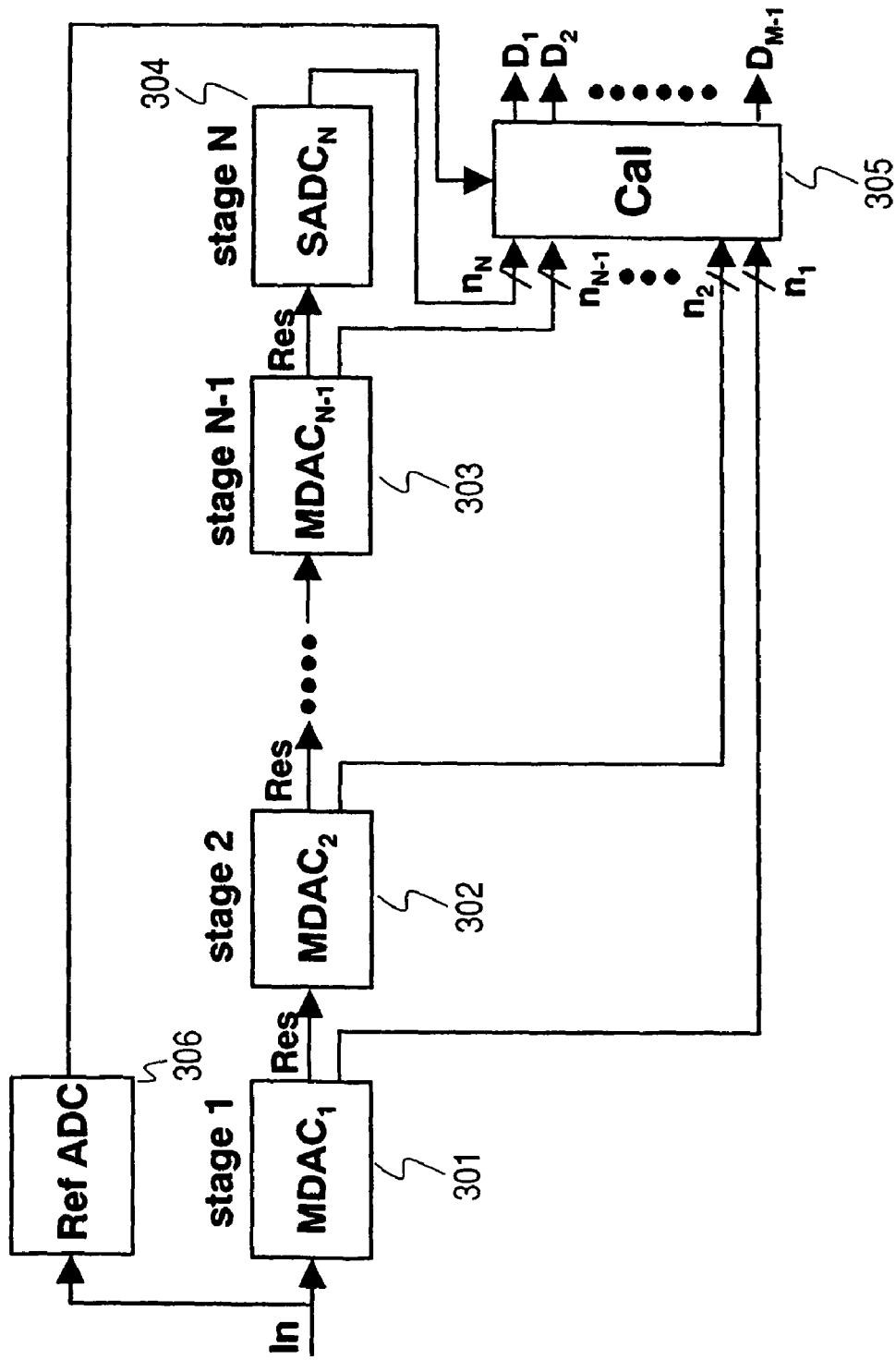
FIG. 4 is a diagram showing a configuration example of a digital calibration type pipelined analog-to-digital converter according to a second embodiment of the present invention.
Figure 5:
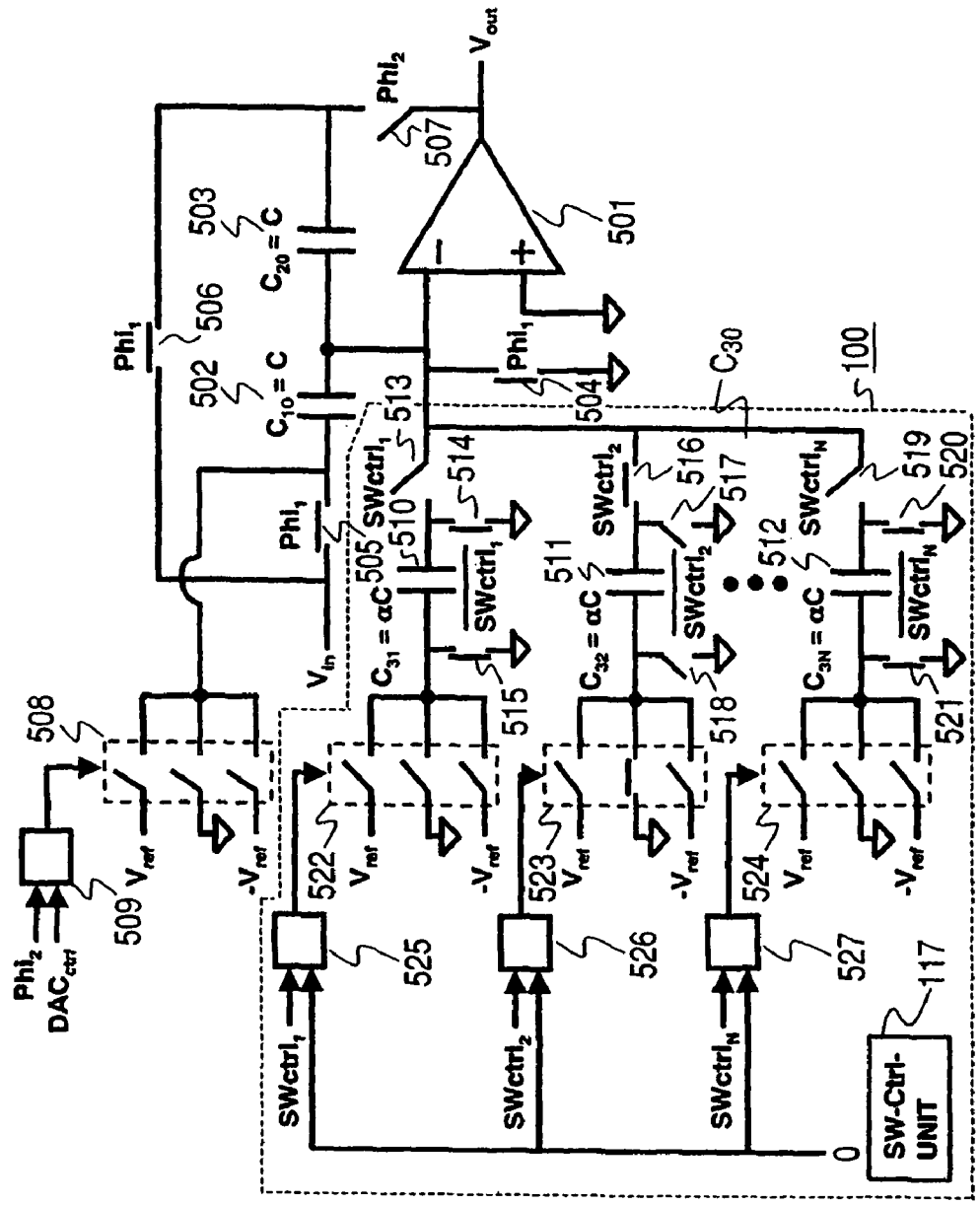
FIG. 5 is a diagram showing an example (in a sample mode) of the circuit configuration of an MDAC used for the analog-to-digital converter shown in FIG. 4.
Figure 6:
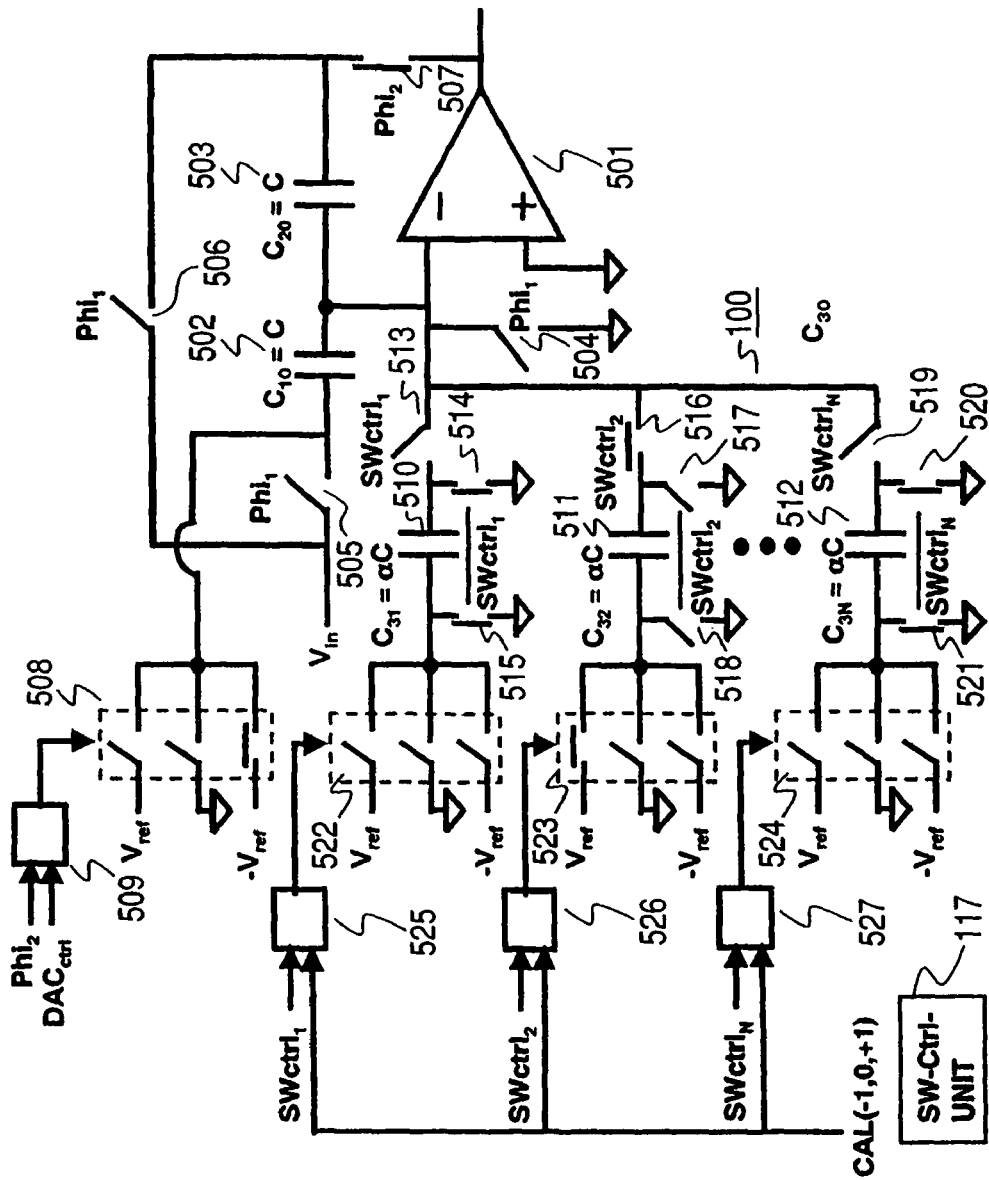
FIG. 6 is a diagram showing an example (in an amp mode) of the circuit configuration of an MDAC used for the analog-to-digital converter shown in FIG. 4.

A second embodiment of the invention, which is exemplified by a digital calibration type pipelined analog-to-digital converter, will be described with reference to FIGS. 4 to 10. FIG. 4 shows a configuration example of a digital calibration of pipelined analog-to-digital converter, and FIG. 5 shows an example of a circuit configuration of an MDAC used for the analog-to-digital converter shown in FIG. 4. Further, a part represented by reference numeral 100 in FIG. 5 corresponds to the capacitive bank shown in FIG. 1. Further, FIG. 5 shows an example of the circuit configuration of an MDAC in a sample mode according to the second embodiment, and FIG. 6 shows an example of the circuit configuration of the MDAC which is in an amp mode according to the second invention.

Referring to FIG. 4, the configuration of the digital calibration of pipelined analog-to-digital converter will be described. In FIG. 4, a first stage of $MDAC_1$ 301 roughly quantizes an analog signal voltage input to the analog-to-digital converter at a bit of $n_1$, and transmits the quantized result to the digital calibration unit 305. Further, the first stage of $MDAC_1$ 301 amplifies the quantization error voltage Res generated during the quantization and then transmits to the next stage of $MDAC_2$ 302 to be processed. The $MDAC_2$ 302 roughly quantizes the error voltage output from the $MDAC_1$ 301 at a bit of $n_2$, and transmits the quantized result to the digital calibration unit 305. Further, the second stage of $MDAC_2$ 302 amplifies the quantization error voltage generated during the quantization and then transmits to a third stage of $MDAC_3$ 303. The subsequence processes are the same as above.

A final stage (Nth stage) is configured by a simple rough quantizer $SADC_N$ 304, and quantizes a quantization error voltage output from the previous stage (N−1th) of $MDAC_{N-1}$ 303 at a bit of $n_N$, and transmits the result to the digital calibration unit 305.

The digital calibration unit 305 calculates the scalar product of a value transmitted from each of the MDACs and a predetermined weight array to determine a final digital output value.

In the digital calibration type analog-to-digital converter, it is possible to reduce the power consumption by decreasing the consumed current of an op-amp used for the MDACs as compared with the related art. However, in this case, since an open-loop gain of the op-amp is reduced, a gain of the MDAC is far from an ideal value. As a result, since the weight array is deviated from a binary array, the digital calibration unit 305 searches an optimal weight array, and then calculates the scalar product with the values transmitted from the MDACs by using the result to maintain the conversion accuracy.

For example, according to the configuration shown in FIG. 4, a reference analog-to-digital converter 306 is connected in parallel to an input terminal. However, since the reference analog-to-digital converter 306 is used for a reference, the reference analog-to-digital converter 306 need to have a high resolution. But the reference analog-to-digital converter 306 operates at a sample rate $f_{clk}/K$ that is sufficiently lower than a sample rate $f_{clk}$ of an analog-to-digital converter according to the related art. Therefore, it is possible to reduce the power consumption of the reference analog-to-digital converter 306. An output of the reference analog-to-digital converter 306 gives the correct conversion result once per K times with respect to the digital calibration unit 305. Accordingly, the digital calibration unit 305 can transmit the correct weight array using the above correct conversion result.

Next, the configuration and the operation of the digital calibration of pipelined analog-to-digital converter according to the second embodiment will be described with reference to FIGS. 5 and 6.

FIG. 5 shows an example of a circuit configuration of the MDAC in a sample mode. The MDAC has a configuration in which an op-amp 501 is negatively fed back through a first capacitor $C_{10}$ 502, a second capacitor $C_{20}$ 503, and a third capacitor $C_{30}$ (100). The third capacitor $C_{30}$ that is connected to an inverting input terminal of the op-amp 501 is configured such that, from a capacitive bank 100 configured by plural capacitive element units (an array of capacitive element units=$C_{31}$ 510 to $C_{3N}$ 512) having substantially the same capacitance value, a switch group control unit 117 selects only one capacitive element unit. The switch group control unit includes CAL DAC switch control units 525, 526, and 527 to which a switch control signal SWctrl and calibrating clock signal CAL are input.

For example, FIG. 5 shows that the switch control unit 117 selects only one capacitive element unit $C_{32}$ 511 as a third capacitor $C_{30}$ from the capacitive bank (array of capacitive element units) 100. The capacitive element unit $C_{31}$ 510 of the capacitive bank 100 is connected to an inverting input terminal of the op-amp 501 through a switch 513 and also connected to a reference voltage through a switch 522. Further, referring to FIG. 5, even though the capacitive element unit $C_{31}$ 510 is connected to any one of $+V_{ref}$, 0 (ground voltage), and $-V_{ref}$, the invention is not limited thereto. Further, the capacitive element unit $C_{31}$ 510 is also connected to the ground voltage through switches 514 and 515. In this case, the switches 513 and 522 are controlled by the switch control signal $SWctrl_1$, and the switches 514 and 515 are controlled by the inversion signal of the switch control signal $SWctrl_1$. Similarly, the capacitive element unit $C_{32}$ 511 is connected to a non-inverting input terminal of the op-amp 501 through a switch 516 and also connected to the reference voltage through a switch 523.

Further, a capacitive element unit $C_{32}$ 511 of the capacitive bank 100 is connected to the ground voltage through switches 517 and 518. Here, the switches 516 and 523 are controlled by the switch control signal $SWctrl_2$, and the switches 517 and 518 are controlled by a non-inverting signal of the switch control signal $SWctrl_2$.

Similarly, the capacitive element unit $C_{3N}$ 512 of the capacitive bank is connected to a non-inverting input terminal of the op-amp 501 through a switch 519 and also connected to the reference voltage through a switch 524. Further, a capacitive element unit $C_{3N}$ 512 is further connected to the ground voltage through switches 520 and 521.

In this case, the switches 519 and 524 are controlled by a switch control signal $SWctrl_N$, and the switches 520 and 521 are controlled by an inversion signal of the switch control signal $SWctrl_N$. In the example shown in FIG. 5, a capacitive element unit $C_{32}$ 511 is selected as a third capacitor $C_{30}$. Therefore, when the switch control signal $SWctrl_2$ is active, the switch 516 is turned on, and only one of switches 523 connected to 0 (ground voltage) is turned on. Further, the switches 517 and 518 are turned off. When the capacitive element unit $C_{32}$ 511 is selected as the third capacitor $C_{30}$, signals other than the switch control signal $SWctrl_2$ become non-active. When the switch control signal $SWctrl_1$ becomes non-active, the switches 513 and 522 are turned off. Further, since the inversion signal of the switch control signal $SWctrl_1$ becomes active, the switches 514 and 515 are turned on. As a result, both terminals of the capacitive element unit $C_{31}$ 510 are connected to the ground voltage, and thus the capacitive element unit $C_{31}$ 510 is in a deselecting status (non-operating status). Similarly, capacitive element units other than the capacitive element unit $C_{32}$ 511 is in a non-operating status.

As shown in FIG. 5, in the sample mode, when a clock $Phi_1$ becomes active, switches 504, 505, and 506 are turned on. Therefore, a first capacitor $C_{10}$ 502 and a second capacitor $C_{20}$ 503 are connected between an input analog voltage $V_{in}$ and the ground voltage. Further, charges that are proportional to the input analog voltage $V_{in}$ are charged on the first capacitor $C_{10}$ 502 and the second capacitor $C_{20}$ 503. At this time, since the clock $Phi_2$ is non-active, switches 507 and 508 are turned off. Further, since the respective CAL DAC switch control units 525, 526, and 527 input 0 signal in the sample mode, when the switch control signals $SWctrl_1$, $SWctrl_2$, and $SWctrl_N$ are active, the respective CAL DAC switch control units 525, 526, and 527 output so as to select 0 (ground voltage) of the switches 522, 523, and 524. In the meantime, when the switch control signals $SWctrl_1$, $SWctrl_2$, and $SWctrl_N$ are non-active, the respective CAL DAC switch control units 525, 526 and 527 output to allow the switches 522, 523, and 524 to be turned off.

According to the example shown in FIG. 5, only capacitive element $C_{32}$ 511 is selected from an array of the capacitive element units of the capacitive bank 100, as a third capacitor $C_{30}$. That is, only the switch control signal $SWctrl_2$ is active, but the other switch control signals SWctrl are non-active. Therefore, among the switches 523, only a switch that is connected to the ground voltage 0 is turned on, and the switches 522 and 524 are turned off. When the switch, which is connected to the ground voltage 0, among the switches 523 is turned on, both terminals of the capacitive element unit $C_{32}$ 511 are connected to the ground voltage. As a result, the charges of the capacitive element unit $C_{32}$ 511 are set to 0.

Next, referring to FIG. 6, the operation in an amp mode according to the second embodiment will be described. As shown in FIG. 6, in the amp mode, when the clock $Phi_1$ becomes non-active, switches 504, 505, and 506 are turned off. Further, when a clock $Phi_2$ becomes active, the switches 507, 508, and 509 are turned on. Therefore, the op-amp 501 is connected to be negatively fed back, and the charges that are charged on the first capacitor $C_{10}$ 502 in the sample mode move onto the second capacitor $C_{20}$ 503. Accordingly, in the amp mode, the analog voltage $V_{in}$ that is input in the sample mode is output two times as much. Simultaneously, even though not shown in FIG. 6, in response to a $DAC_{ctrl}$ signal that is generated on the basis of the rough quantization result performed by a comparator array, the DAC switch control unit 509 turns on only one switch among the switches 508 when the clock $Phi_2$ becomes active, that is, in the amp mode.

For example, in FIG. 6, a switch that is connected to the reference voltage $-Vref$ is turned on. In response to the voltage of the connected reference voltage, the quantity of charges that further move onto the second capacitor $C_{20}$ 503 is changed. In other words, subtraction of the charges is performed based on the rough quantization result. A capacitive element unit that is selected as the third capacitor $C_{30}$ needs to be the same as the capacitive element unit in the sample mode, that is, the third capacitor $C_{30}$ is the same as the capacitive element unit $C_{32}$ 511. Therefore, similar to the sample mode, when the switch control signal $SWctrl_2$ becomes active, the switches 516 and 523 are turned on. Further, the switches 517 and 518 are turned off. Furthermore, signals other than the switch control signal $SWctrl_2$ become non-active. When the switch control signal $SWctrl_1$ becomes non-active, the switches 513 and 514 are turned off. In this case, since the inversion signal of the switch control signal $SWctrl_1$ becomes active, the switches 514 and 515 are turned on. As a result, since both terminals of the capacitive element unit $C_{31}$ 510 are connected to the ground voltage, the capacitive element unit $C_{31}$ 510 is in a deselecting status (non-operating status). Similarly, all capacitive element units in the capacitive bank 100 but the capacitive element unit $C_{32}$ 511 is in a non-operating status.

The respective CAL DAC switch control units 525, 526, and 527 input a CAL signal that is a calibration signal in the amp mode. Therefore, when the switch control signals $SWctrl_1$, $SWctrl_2$, and $SWctrl_N$ are active, the CAL DAC switch control units 525, 526, and 527 output so as to select a switch that is connected to a reference voltage corresponding to the CAL signal, among the switches 522, 523, and 524. Further, when the switch control signals $SWctrl_1$, $SWctrl_2$, and $SWctrl_N$ becomes non-active, the CAL DAC switch control units 525, 526, and 527 output such that the switches 522, 523, and 524 are turned off.

According to the example shown in FIG. 6, only capacitive element unit $C_{32}$ 511 is selected from the array of capacitive element units of the capacitive bank 100. That is, only the switch control signal $SWctrl_2$ is active, the other switch control signals $SWctrl$ are non-active. Therefore, among the switches 523, any one of switches that are connected to any one of $+V_{ref}$, 0 (ground voltage), and $-Vref$ is turned on in response to the CAL signal. For example, in FIG. 6, corresponding to the case when the CAL signal is 1, a switch that is connected to the reference voltage Vref is turned on. Further, the switches 522 and 524 are turned off.

Accordingly, a left terminal of the capacitive element unit $C_{32}$ 511 is connected to the reference voltage corresponding to the CAL signal, and a right terminal thereof is connected to a non-inverting terminal of the op-amp 501. In this case, the quantity of the charges that move onto the second capacitor $C_{20}$ 503 in response to the reference voltage connected to the left terminal of the capacitive element unit $C_{32}$ 511. In this case, a value that is α times the capacitance of the first capacitor $C_{10}$ 502 or the second capacitor $C_{20}$ 503 is determined as the value of the array of the capacitive element units $C_{31}$ 510 to $C_{3N}$ 512. Therefore, the value is equivalent the value obtained by subtracting the voltage of $V_{ref}/16$ from the output of the op-amp 501.

In other words, according to the configuration example of FIG. 6, in the amp mode, a voltage obtained by subtracting a voltage, for example, $V_{ref}/16$, determined depending on the calibration clock signal CAL from a voltage that doubles the quantization error that is subtraction of the analog input voltage $V_{in}$ in the sample mode and the rough quantization result serves as an output of the op-amp 501.

The calibration clock signal CAL is any one of +1, −1, and 0. Correspondingly, $V_{ref}/16$, $-V_{ref}/16$, and 0 are subtracted from the voltage that doubles the quantization error that is subtraction of the analog input voltage $V_{in}$ in the sample mode from the rough quantization result.

As described above, when the MDAC output voltage is intentionally changed by the calibration signal CAL, it is possible to significantly reduce the time when the digital calibration unit 305 takes to reach the correct weight array, that is, the convergence of the digital calibration.

Here, in order to avoid the saturation of the output voltage of the op-amp 501, a value that is sufficiently smaller than 1 is selected as α. Therefore, since the capacitance of the array of the capacitive element units $C_{31}$ 510 to $C_{3N}$ 512 of the capacitive bank needs to have very small value, this embodiment may be effectively applied.

The above-mentioned is just an example of a selection circuit of a capacitive element unit, a calibration method, and a calibration circuit, and another circuit configuration may be also used.

Figure 7:
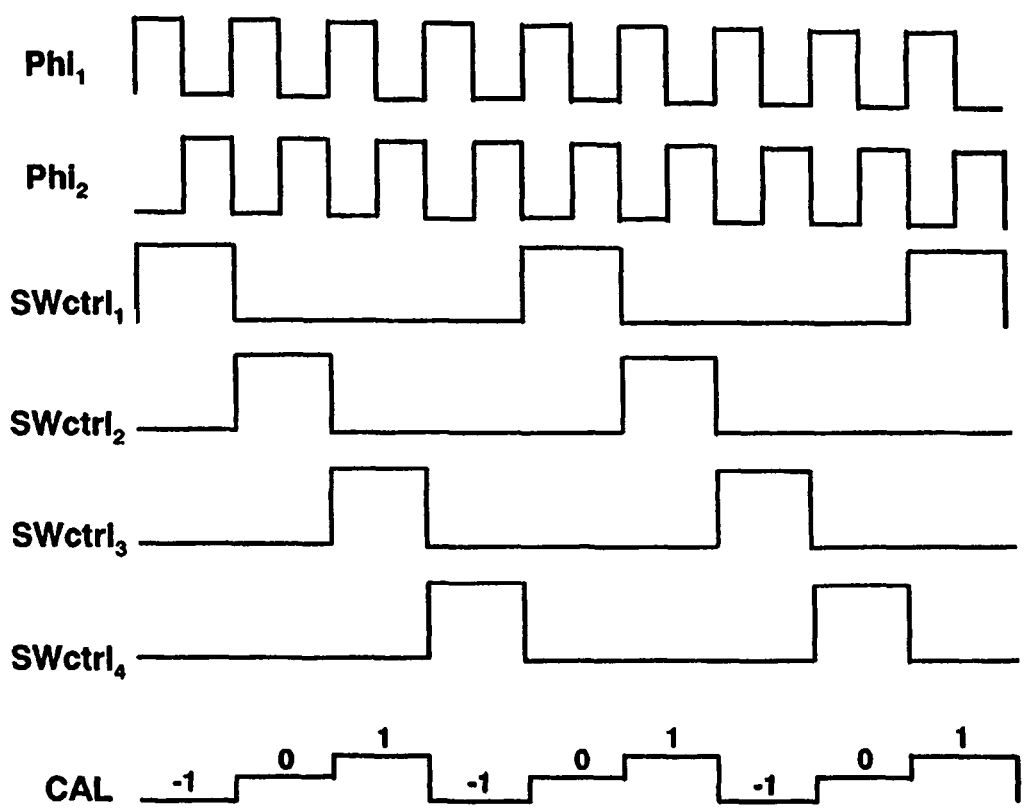
FIG. 7 is a diagram illustrating an operation timing according to the second embodiment.

FIG. 7 shows a selection method of capacitive element units $C_{31}$ 510 to $C_{3N}$ 512 of the capacitive bank by using the switch group control unit 117 according to the second embodiment, that is, an example of a method of generating the switch control signal $SWctrl_N$ from the switch control signal $SWctrl_1$ shown in FIGS. 5 and 6. Further, clock signals $Phi_1$ and $Phi_2$ that switch the sample mode and the amp mode are also shown.

According to this embodiment, in order to select only one of capacitive element units of the capacitive bank, only one switch control signal $SWctrl_N$ of the switch control signals SWctrl is active, but two or more switch control signals SWctrl are not simultaneously active. Further, in order to reduce the influence of the variation of the capacitive element units as much as possible, the capacitive element units of the capacitive bank need to be selected with the substantially equal possibility. Therefore, the frequencies when the switch control signals SWctrl are active become substantially equal.

For example, as shown in FIG. 7 (N=4), in order to periodically select each of the capacitive element units at every operation clock, as the switch control signal SWctrl, periodic signals whose ON timings are staggered from each other may be selected. Further, the switch control signal SWctrl may be generated so as to randomly select only one of the capacitive element units at every operation clock. As far as only one of the capacitive element units are selected with the equal possibility, any kinds of selections may be allowed.

According to the second embodiment, it is possible to reduce the influence of the variation in the specific accuracy of the capacitive element having a small capacitance. Therefore, the deterioration of the non-linearity of the analog-to-digital converter due to the variation in the specific accuracy of the capacitance can be suppressed more than the related art. As a result, SNDR, that is, the effective number of bit (ENOB) is improved.

Figure 8:
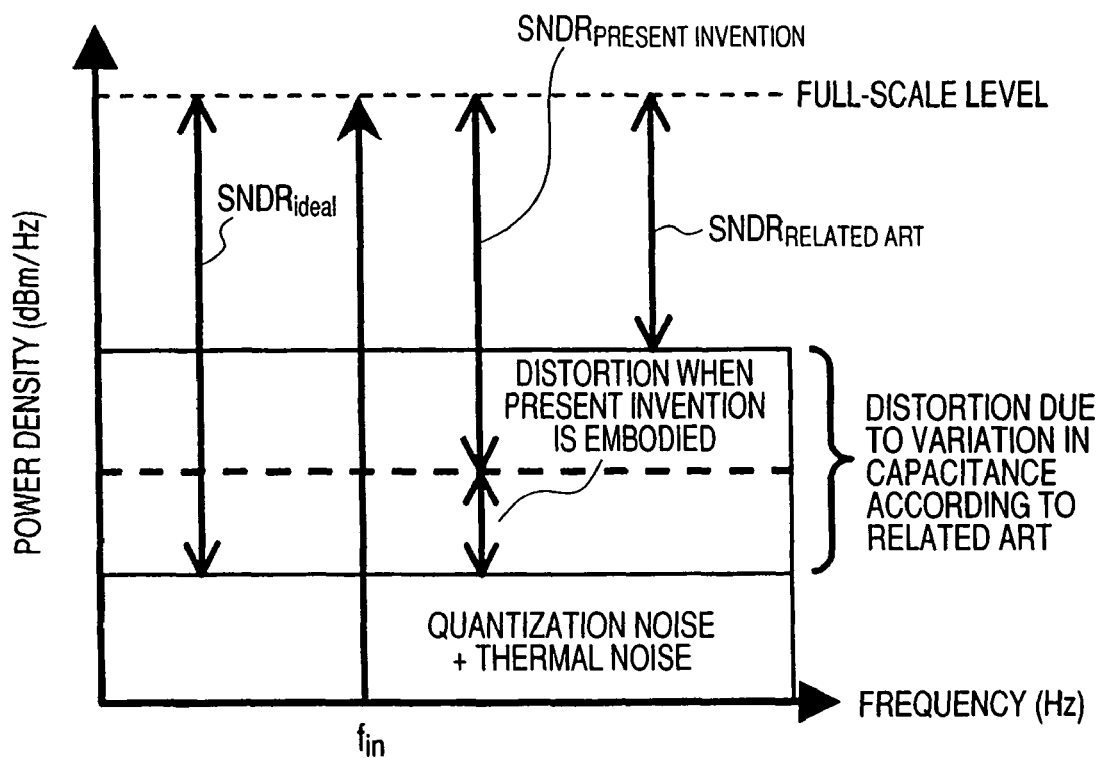
FIG. 8 is a diagram illustrating an effect of the present invention regarding to a deterioration of a spectrum accompanied by the variation in the specific accuracy of capacitance.

The above aspect is shown in FIG. 8. In addition to the inevitable deterioration component due to a quantization noise and a thermal noise (kT/C noise), a deterioration component of a spectrum accompanied by the variation of the specific accuracy of capacitance exists. However, the present invention can reduce the amount of deterioration to be smaller than the related art.

Figure 9:
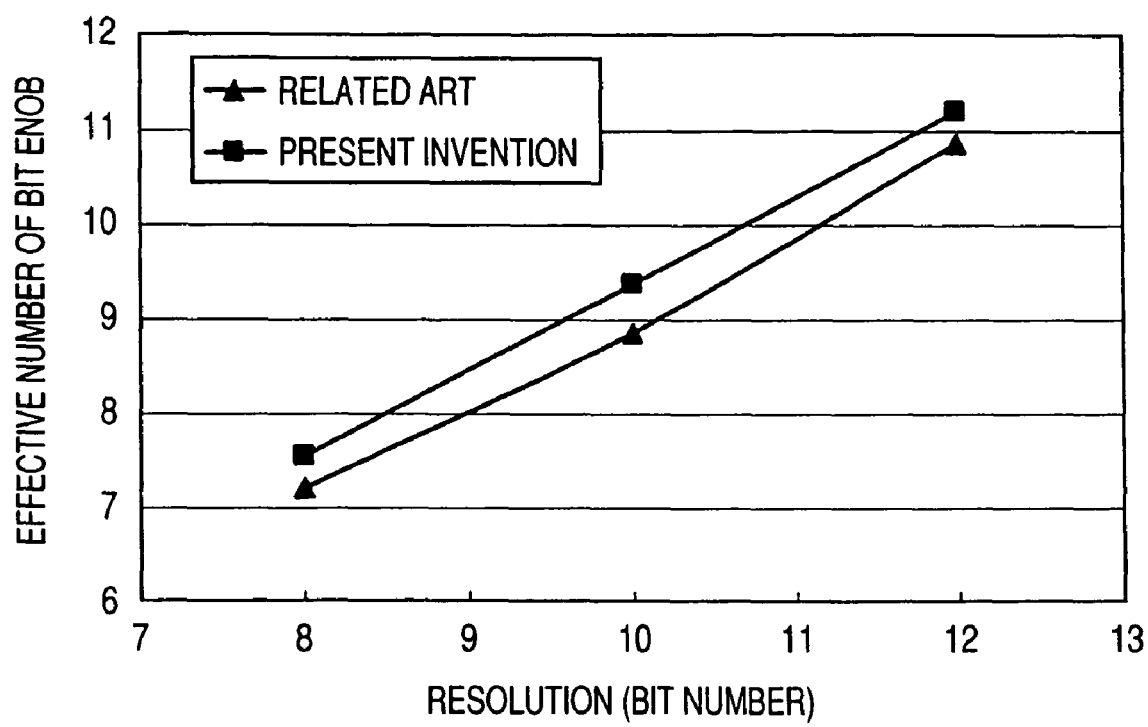
FIG. 9 is a diagram illustrating an effect of the improvement of SNDR according to the present invention.

Further, as shown in FIG. 9, in case of the variation of the specific accuracy of capacitance of the normal CMOS process, it is possible to expect that the SNDR is improved to about 3 dB as compared with the related art, that is, the effective number of bit (ENOB) is improved to 0.5 bit by executing the second embodiment on the digital calibration type analog-to-digital converter with N=5, and the periodical switch control signal SWctrl.

The above effect will be described with reference to FIG. 10 at the other viewpoint. Generally, the power consumption of the analog-to-digital converter becomes larger as the capacitance used in the circuit becomes larger. Therefore, the capacitance is reduced as much as possible within a range that the thermal noise influenced by the capacitance, that is, kT/C noise is sufficient smaller than the quantization noise. As a result, the capacitance is required to have the value larger than $C_{noise}$ shown in FIG. 10. In the meantime, from the viewpoint of the linearity of the analog-to-digital converter, or SNDR, that is, the effect number of bits (ENOB), the variation of the specific accuracy of capacitance of the capacitive element is also required to have a predetermined value or less (for example, 0.1% in FIG. 10). As a result, as shown in FIG. 10, the capacitance needs to be $C_{distortion}$ or more.

Figure 10:
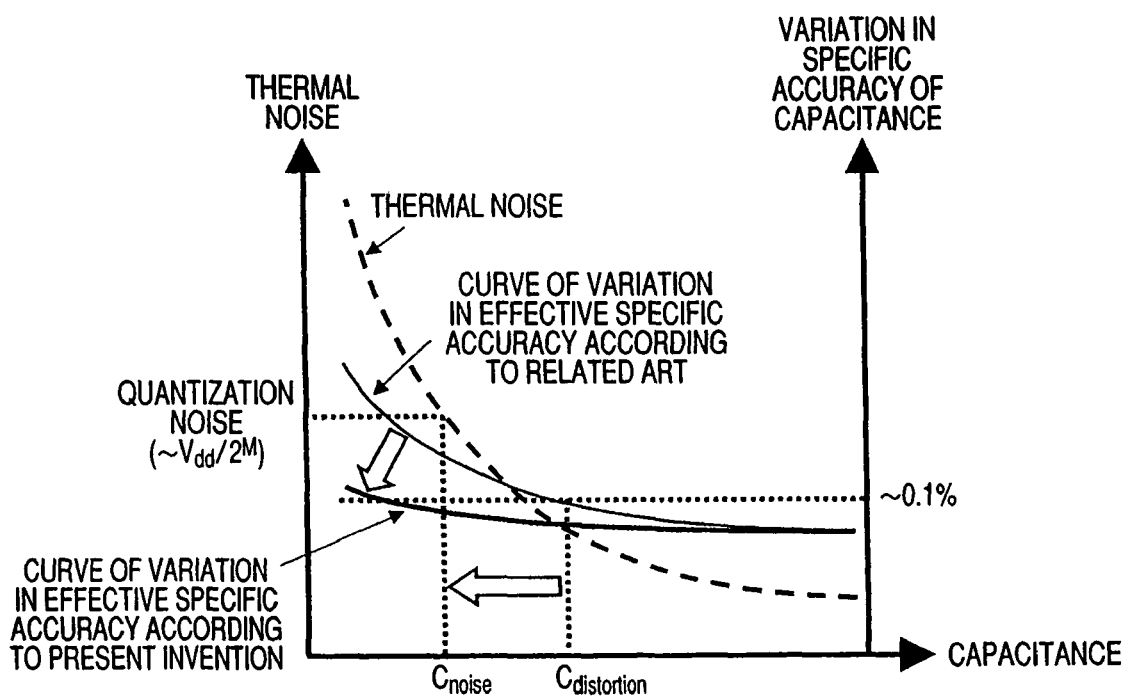
FIG. 10 is a diagram illustrating an effect of the present invention that the variation in the specific accuracy of capacitance is reduced.

In the digital calibration type analog-to-digital converter, or the other types of analog-to-digital converter, as shown in FIG. 10, $C_{distortion}$ is larger than $C_{noise}$. Therefore, when $C_{distortion}$ is used as the capacitance, the power consumption is larger than the power consumption determined by $C_{noise}$.

Meanwhile, as shown in FIG. 10 by using a white arrow, the variance of the specific accuracy is effectively reduced smaller than the related art by reducing the influence of the variance of the specific accuracy of capacitance. Therefore, it is possible to make $C_{distortion}$ larger than $C_{noise}$. As a result, $C_{noise}$ can be used as a capacitance value of the analog-to-digital converter, and it is further possible to reduce the power consumption of the analog-to-digital converter according to the second embodiment of the present invention more than the related art.

As described above, according to the second embodiment, it is possible to reduce the influence of the variation in the specific accuracy of the capacitive element with the simple configuration without increasing the power consumption. As a result, capacitive elements having a small capacitance may be used, which reduces the power consumption of the analog-to-digital converter.

Third Embodiment

Figure 11:
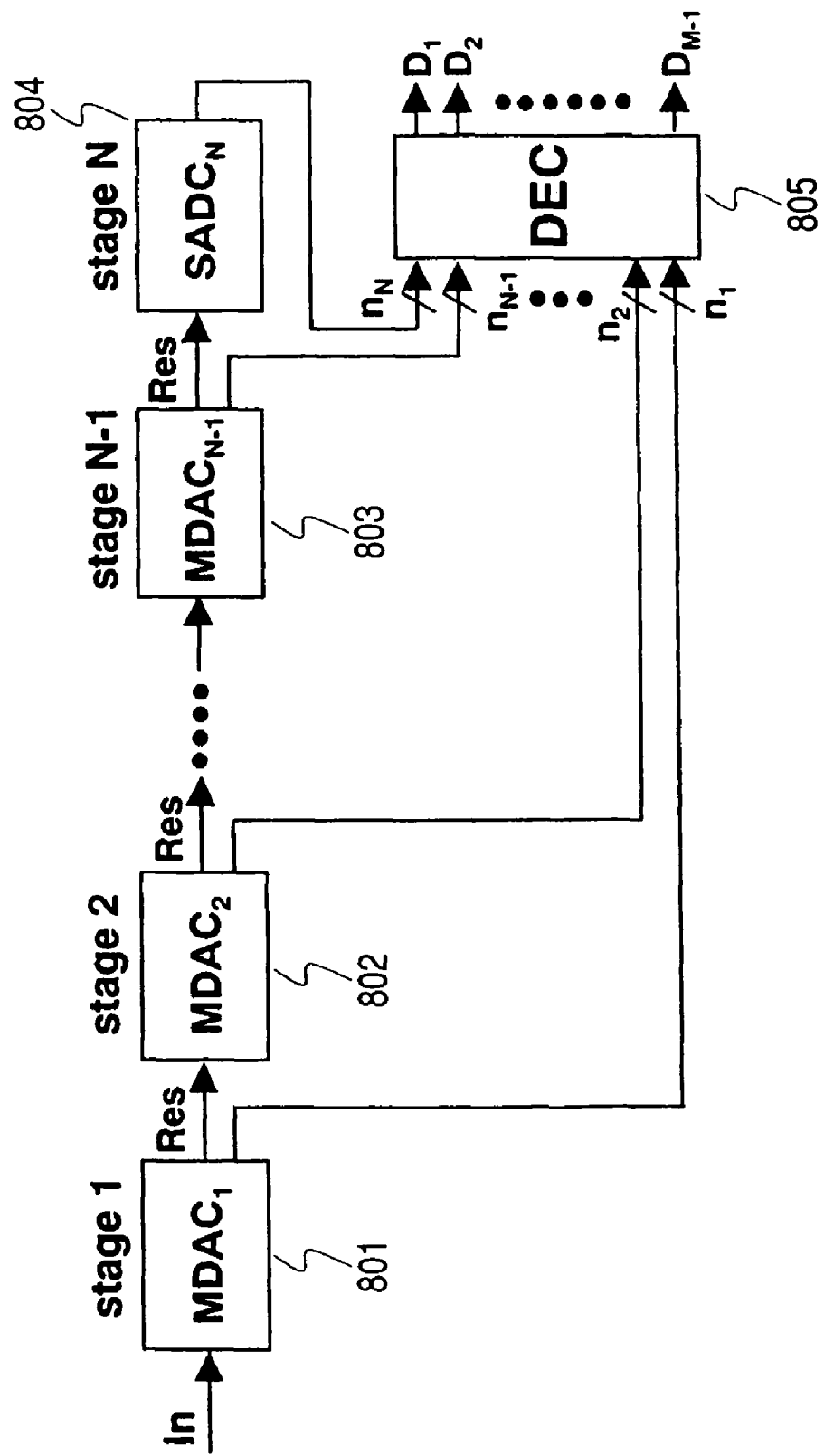
FIG. 11 is a diagram showing a configuration example of a pipelined analog-to-digital converter according to a third embodiment of the present invention.
Figure 12A:
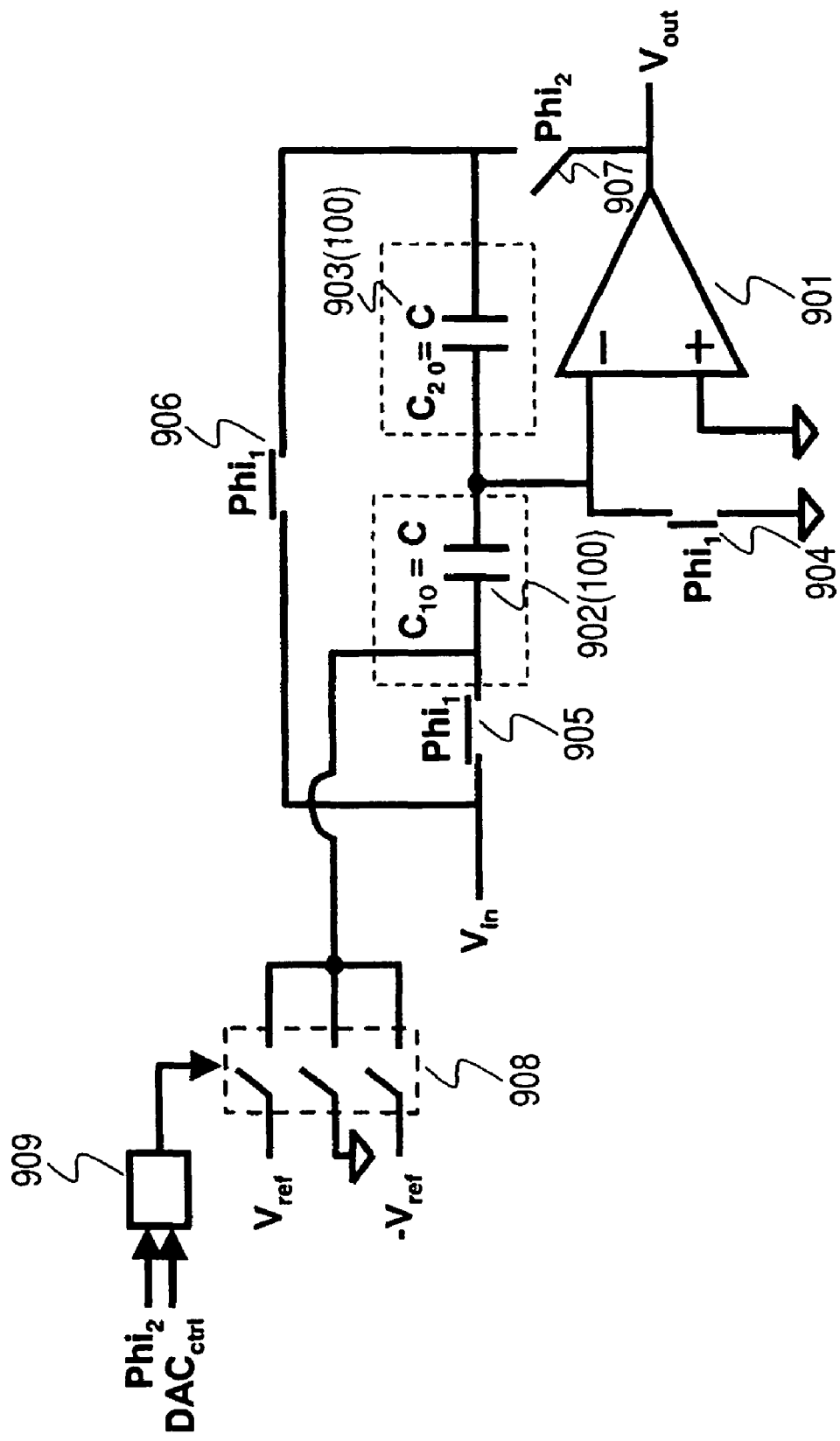
FIG. 12A is a diagram showing a configuration example (in a sample mode) of an MDAC used for the analog-to-digital converter according to a third embodiment of the present invention.

An example in which this invention is applied to a pipelined analog-to-digital converter will be described as a third embodiment, with reference to FIGS. 11, 12A, 12B, and 12C. FIG. 11 shows a general configuration of the pipelined analog-to-digital converter. The pipelined analog-to-digital converter obtains a predetermined resolution by connecting an $MDAC_1$ 801 to the respective stages of a stage $MDAC_{N-1}$ 803 in series. The configuration of the respective MDAC is shown in FIG. 12A. According to the third embodiment, parts corresponding to capacitors $C_{10}$ and $C_{20}$ that configure the respective MDAC shown in FIGS. 12A and 12C is configured by a capacitive bank 100 shown in FIG. 12B. Further, FIG. 12A shows a sample mode of the respective MDAC, and FIG. 12C shows an amp mode of the respective MDAC.

Referring to FIG. 11, each of the MDACs roughly quantizes the input analog voltage, amplifies the quantization error caused by the rough quantization, and then transmits the error to the next stage of MDAC to be processed. For example, a first stage of $MDAC_1$ 801 roughly quantizes an analog signal voltage input to the analog-to-digital converter at a bit of n1, and transmits the quantized result to the digital error calibration unit 805. Further, the first stage of $MDAC_1$ 801 amplifies the quantization error voltage Res generated during the quantization and then transmits to the next stage of $MDAC_2$ 802 to be processed. The $MDAC_2$ 802 roughly quantizes the error voltage output from the $MDAC_1$ 801 at a bit of n2, and transmits the quantized result to the digital error calibration unit 805. Further, the second stage of $MDAC_2$ 802 amplifies the quantization error voltage generated during the quantization and then transmits to a third stage of MDAC. The subsequence processes are same as the above.

A final stage (Nth stage) is configured by a simple rough quantizer $SADC_N$ 804, and quantizes a quantization error voltage output from the previous stage (N-1th) $MDAC_{N-1}$ 803 at a bit of $n_N$, and transmits the result to the digital error calibration unit 805. The digital error calibration unit 805 calculates the scalar product of a value transmitted from each of the MDACs and a predetermined binary value array to determine a final digital output value.

The respective MDACs operate in the sample mode and the amp mode, for example, have the configuration shown in FIGS. 12A and 12C. The MDAC has a basic configuration in which an op-amplifier 901 is negatively fed back by a first capacitor $C_{10}$ 902 and a second capacitor $C_{20}$ 903, and a third capacitor $C_{30}$ 1110. The connection is changed by switches 904, 905, 906, 907, and 908 to be switched between two modes. Further, even though the switch 908 is configured so as to be connected to any one of $+V_{ref}$, 0 (ground voltage), $-V_{ref}$ corresponding to the sample mode or the amp mode of the pipelined analog-to-digital converter, the switch is not limited thereto.

Figure 12B:
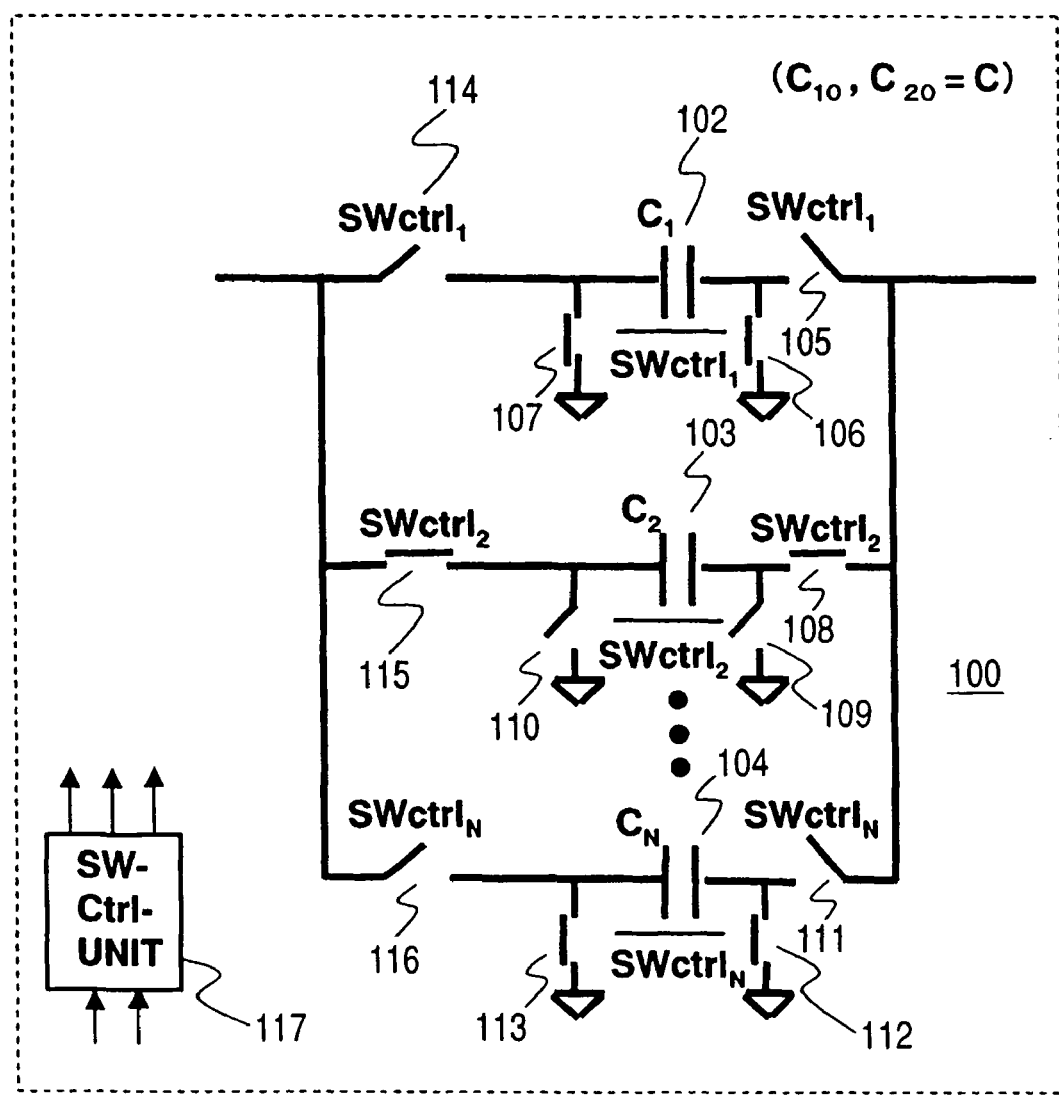
FIG. 12B is a diagram showing a configuration example of a capacitive bank according to the third embodiment of the present invention.
Figure 12C:
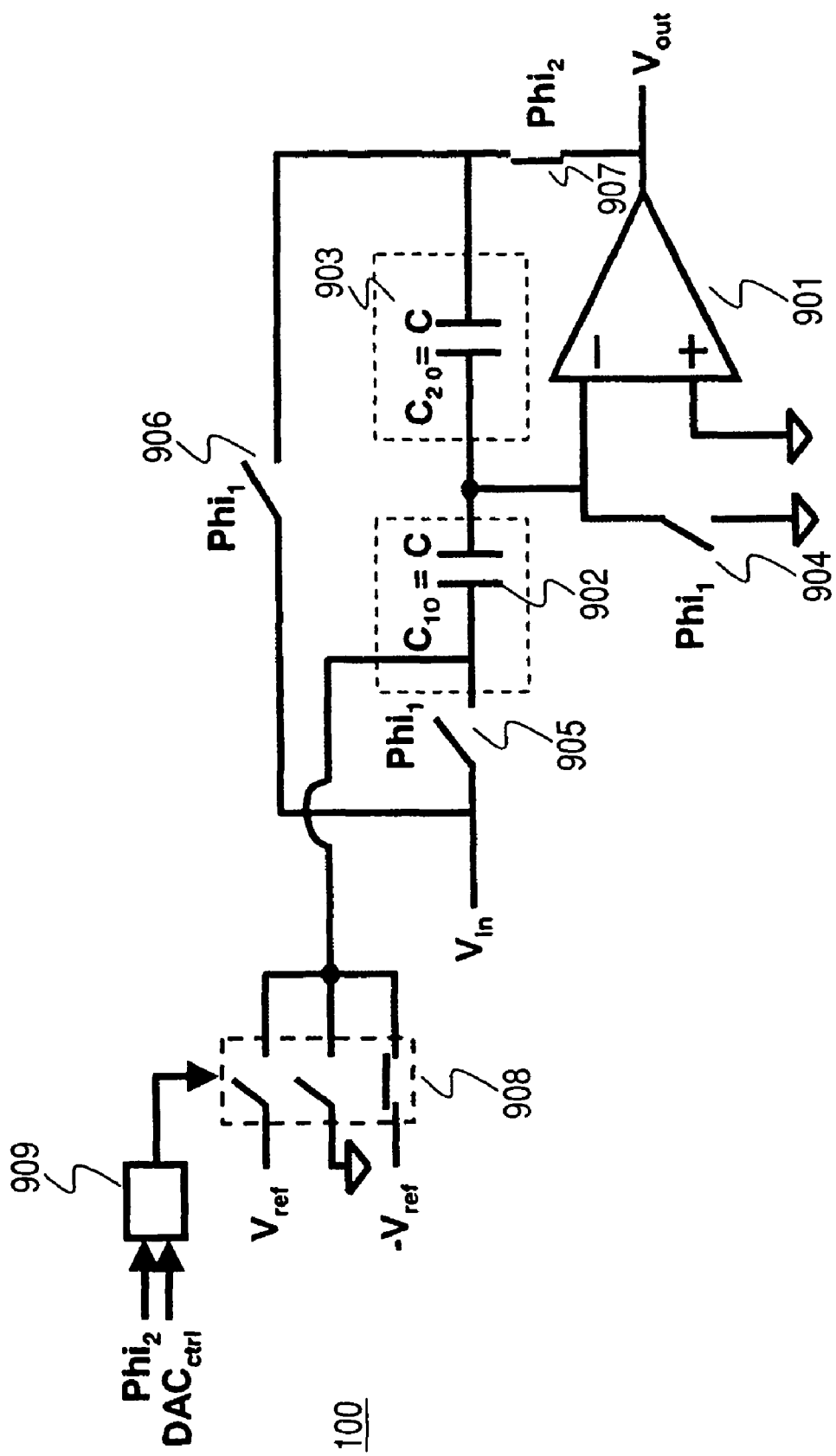
FIG. 12C is a diagram showing a configuration example (in an amp mode) of an MDAC used for the analog-to-digital converter according to the third embodiment of the present invention.

As shown in FIG. 12B, as a first capacitor $C_{10}$ 902, only one (capacitive element unit $C_2$ in FIG. 12B) is selected from the capacitive bank 100 configured by an array of a plurality (N) capacitive element units $C_1$ to $C_N$ having substantially same capacitance with substantially equal probability. Therefore, one end of the capacitive element unit $C_2$ 103 that configures the capacitive bank 100 is connected to the inverting input terminal of the op-amp 901 through a switch 108 that is controlled by the switch group control unit 117, and the other end thereof is connected to the switch 908 through a switch 115 that is controlled by the same switch group control unit 117. Further, the switches 109 and 110 that connect the capacitive element unit $C_2$ 103 to the ground voltage is open. In this case, as shown in FIG. 3, the switches 108 and 115 are controlled by the switch control signal $SWctrl_2$, and the switches 109 and 110 are controlled by the inversion signal of the switch control signal $SWctrl_2$.

However, both terminals of the capacitive element unit $C_1$ 102 that is not selected are connected to the ground voltage through the switches 106 and 107. Further, both terminals of the capacitive element unit $C_N$ 104 that is not selected are connected to the ground voltage through the switches 112 and 113.

Similarly, even in case that the capacitive element unit $C_1$ 102 or $C_N$ 104 is selected as the first capacitor $C_{10}$ 902, the selected capacitive element unit is connected between the inverting input terminal of the op-amp 901 and the switch 908 through the switches.

Further, as for the second capacitor $C_{20}$ 903, similarly to the first capacitive element $C_{10}$ 902, only one of the capacitive bank 100 configured by an array of a plurality (N) of capacitive element units $C_1$ to $C_N$ having substantially the same capacitance value as the first capacitive element unit array is selected with substantially equal probability.

As shown in FIG. 12A, in the sample mode, the clock Phi1 is active, and thus the switches 904, 905, and 906 are turned on. Thereby, one of the capacitive element unit array $C_1$ to $C_N$ that configure the first $C_{10}$ 902 and one of the other array of the capacitive element units $C_1$ to $C_N$ that configure the second $C_{20}$ 903 are connected between the input analog voltage $V_{in}$ and the ground DC voltage (hereinafter, referred to as a ground). The charges that are proportional to the input analog voltage $V_{in}$ are charged on the first capacitor $C_{10}$ 902 and the second capacitor $C_{20}$ 903. In this case, the clock Phi2 is non-active, and thus the switches 907 and 908 are turned off.

Meanwhile, as shown in FIG. 12C, in the amp mode, when the clock Phi1 becomes non-active, the switches 904, 905, and 906 are turned off. Further, when the clock Phi2 becomes active, the switches 907 and 908 are turned on. Therefore, the op-amp 901 is negatively fed back, and the charges that are charged on the first capacitor $C_{10}$ 902 in the sample mode move onto the second capacitor $C_{20}$ 903. Accordingly, in the amp mode, the analog voltage $V_{in}$ that is input in the sample mode is output two times as much. Simultaneously, even though not shown in FIG. 12C, in response to a $DAC_{ctrl}$ signal that is generated on the basis of the rough quantization result performed by a comparator array, the DAC switch control unit 909 turns on only one switch among the switches 908 when the clock Phi2 becomes active, that is, in the amp mode.

For example, in FIG. 12C, a switch that is connected to the reference voltage $-V_{ref}$ is turned on. In response to the connected reference voltage, the quantity of charges that further move onto the second capacitor $C_{20}$ 903 is changed. That is, subtraction of the charges is performed based on the rough quantization result. In other words, according to the configuration shown in FIG. 12C, in the amp mode, a voltage that doubles the quantization error that is the subtraction of the input analog voltage $V_{in}$ in the sample mode and the rough quantization result may be obtained as the output of the op-amp 901. Therefore, the desirable operation of the MDAC may be performed.

The combination of the second embodiment and the third embodiment may be used. In other words, the first capacitor $C_{10}$ 502, the second capacitor $C_{20}$ 503, and the third capacitor $C_{30}$, which are connected to the op-amp 501, configure the capacitive bank, and only one capacitive element unit may be selected from the capacitive bank by the switch group control unit.

According to the third embodiment, it is possible to reduce the influence of the variation in the specific accuracy of the capacitive elements with the simple circuit configuration and the control method without increasing the power consumption. As a result, since capacitive elements having small capacitance can be used for an analog-to-digital converter, the power consumption can be reduced.

Fourth Embodiment

An example in which this invention is applied to a successive approximation analog-to-digital converter will be described as a fourth embodiment, with reference to FIG. 13. The successive approximation analog-to-digital converter includes a capacitive network 1001, a comparator 1002, and a register 1003. The capacitive network 1001 includes plural capacitive banks 100 configured by an array of a plurality (N) of capacitive element units $C_1$ to $C_N$ having the same capacitance. The capacitive bank 100, similarly to the first embodiment, includes an array of a plurality (N) of capacitive element units $C_1$ to $C_N$, N element switch array in which each pair of switches are connected at both terminals of each capacitive element unit, and a switch group control unit 117 that controls the element switches to be turned on or off for every clock signal on the basis of a switch control signal SWctrl. By selecting only one capacitive element for every capacitive bank 100 with substantially equal probability, every capacitive element in the capacitive network 1001 can be embodied.

Figure 13:
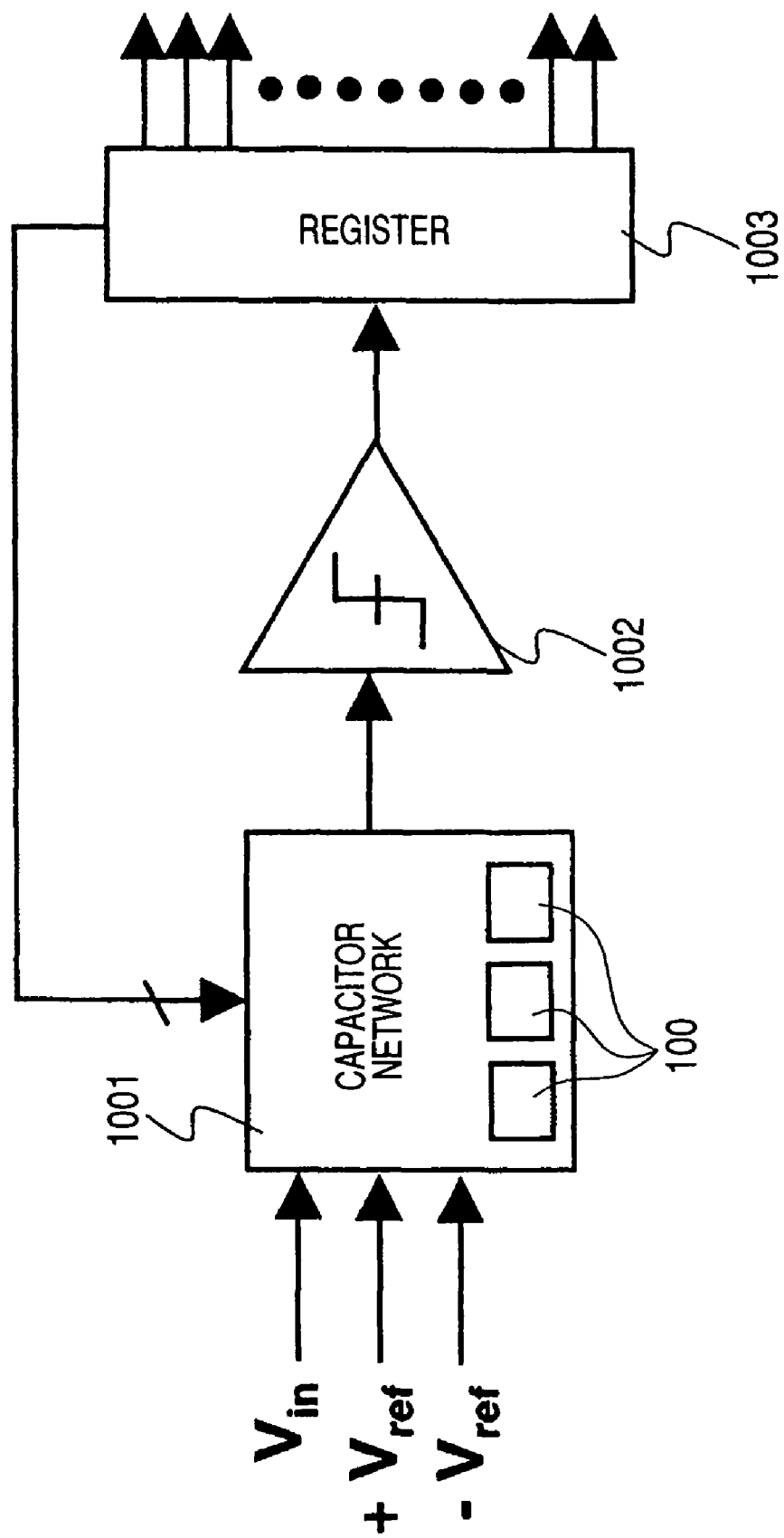
FIG. 13 is a diagram showing a configuration example of a successive approximation analog-to-digital converter according to a fourth embodiment of the present invention.

Referring to FIG. 13, the input analog voltage $V_{in}$ is input to the capacitive network 1001. The capacitive network 1001 calculates the subtraction and the digital-to-analog conversion. Therefore, on the basis of the switch control signal output by the register 1003, the capacitive network 1001 controls the switches therein to be turned on/off, and thereby controls the connection relationship of the capacitors in the capacitive network 1001. An analog voltage determined depending on the connection relationship of the capacitors is obtained by converting an output code corresponding to the current conversion result into an analog signal. Further, in the capacitive network 1001, the voltage is subtracted from the input analog voltage $V_{in}$, thereby the quantization error with respect to the current conversion is output from the capacitive network 1001.

The quantization error with respect to the current conversion that is output from the capacitive network 1001 is input to the comparator 1002, and then determines whether the sign thereof is positive or negative is determined. The register 1003 updates the register value that is currently maintained, in response to the sign of the quantization error with respect to the current conversion determined by the comparator 1002. The register 1003 sequentially confirms the code for one bit at a time from MSB to LSB. Therefore, the respective switches in the capacitive network 1001 are sequentially and appropriately controlled, and the sign of the quantization error at this time is detected by the comparator 1002. Therefore, in response to the detected result, it is determined whether the code value of a bit that is currently judged is 0 or 1.

According to the fourth embodiment, it is possible to reduce the influence of the variation in the specific accuracy of the capacitive elements with the simple circuit configuration and the control method without increasing the power consumption. As a result, since capacitive elements having small capacitance can be used for an analog-to-digital converter, the power consumption can be reduced.

Fifth Embodiment

An example in which this invention is applied to a wireless transceiver will be described as a fifth embodiment, with reference to FIG. 14. The wireless transceiver includes a wireless receiver circuit and a wireless transmitter circuit 409 that are connected to a transmission and reception switching unit 401. The wireless receiver circuit includes a radio frequency circuit 402, a low frequency circuit (a filter 403, a variable gain amplifier 404, and an automatic gain control unit 408) connected to an output of the radio frequency circuit 402, an analog-to-digital converter 405 that is connected to an output of the low frequency circuit, a digital calibration unit 406 that calibrates to improve the effective resolution of the analog-to-digital converter, and a digital signal processor 407 that is configured by a digital signal processing processor.

Figure 14:
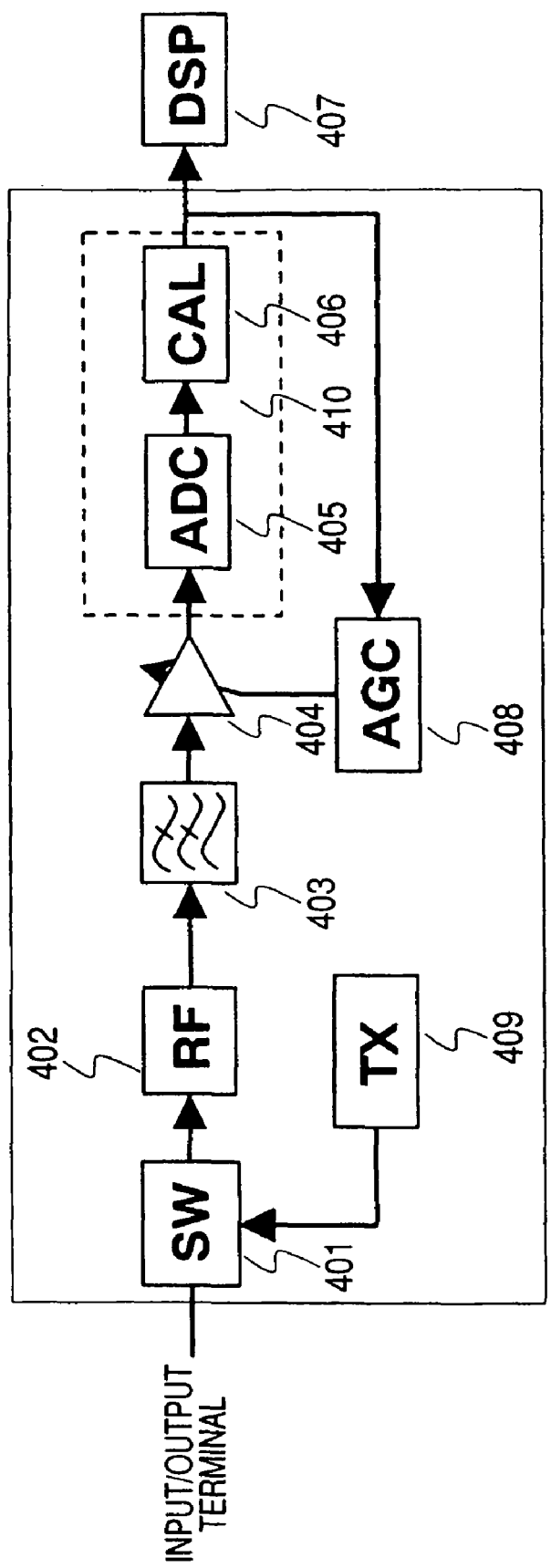
FIG. 14 is a diagram showing a configuration example of a wireless transceiver according to a fifth embodiment of the present invention.
Figure 15:
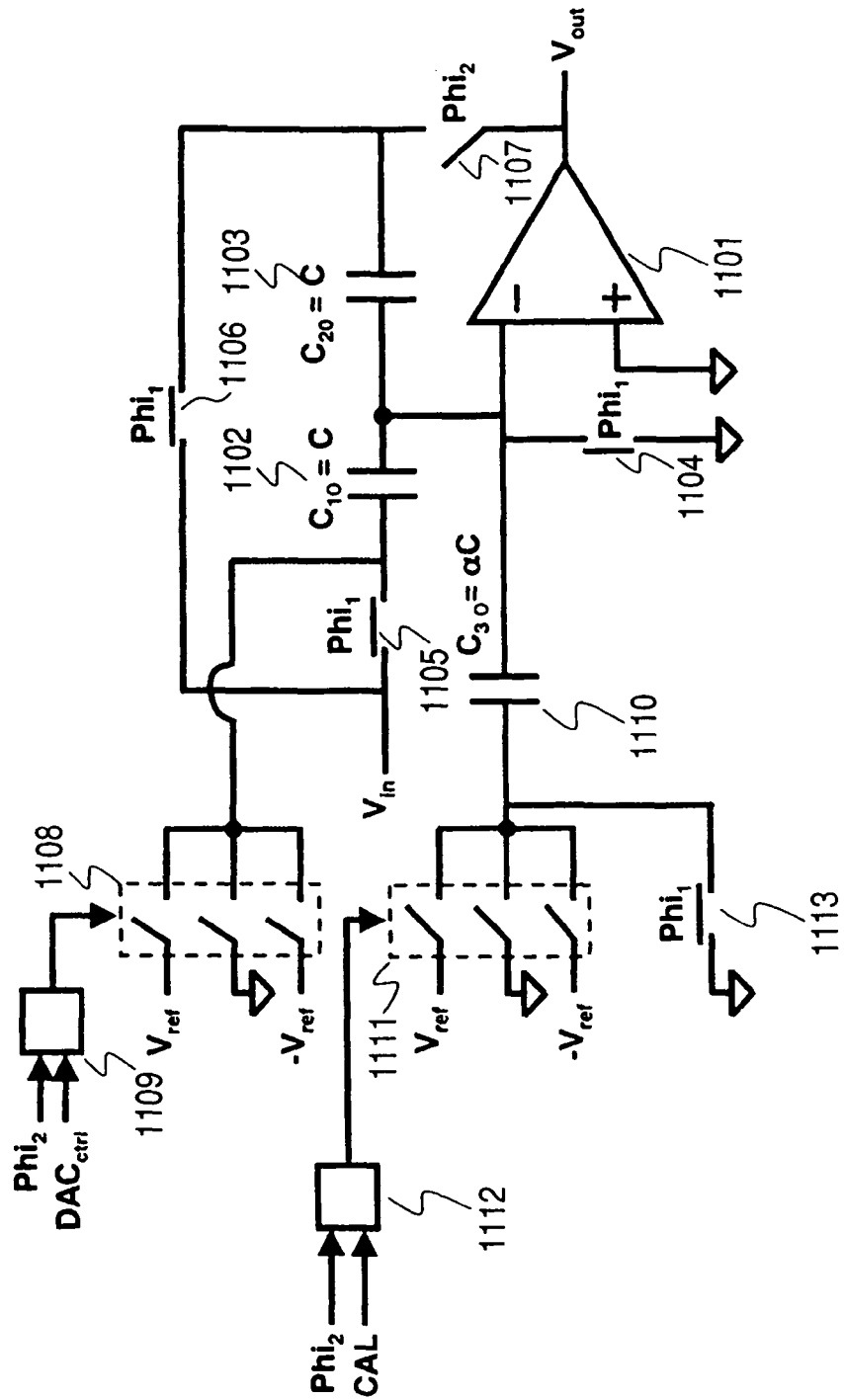
FIG. 15 is a diagram showing a configuration example (in a sample mode) of an MDAC circuit of a digital calibration type analog-to-digital converter according to the related art.
Figure 16:
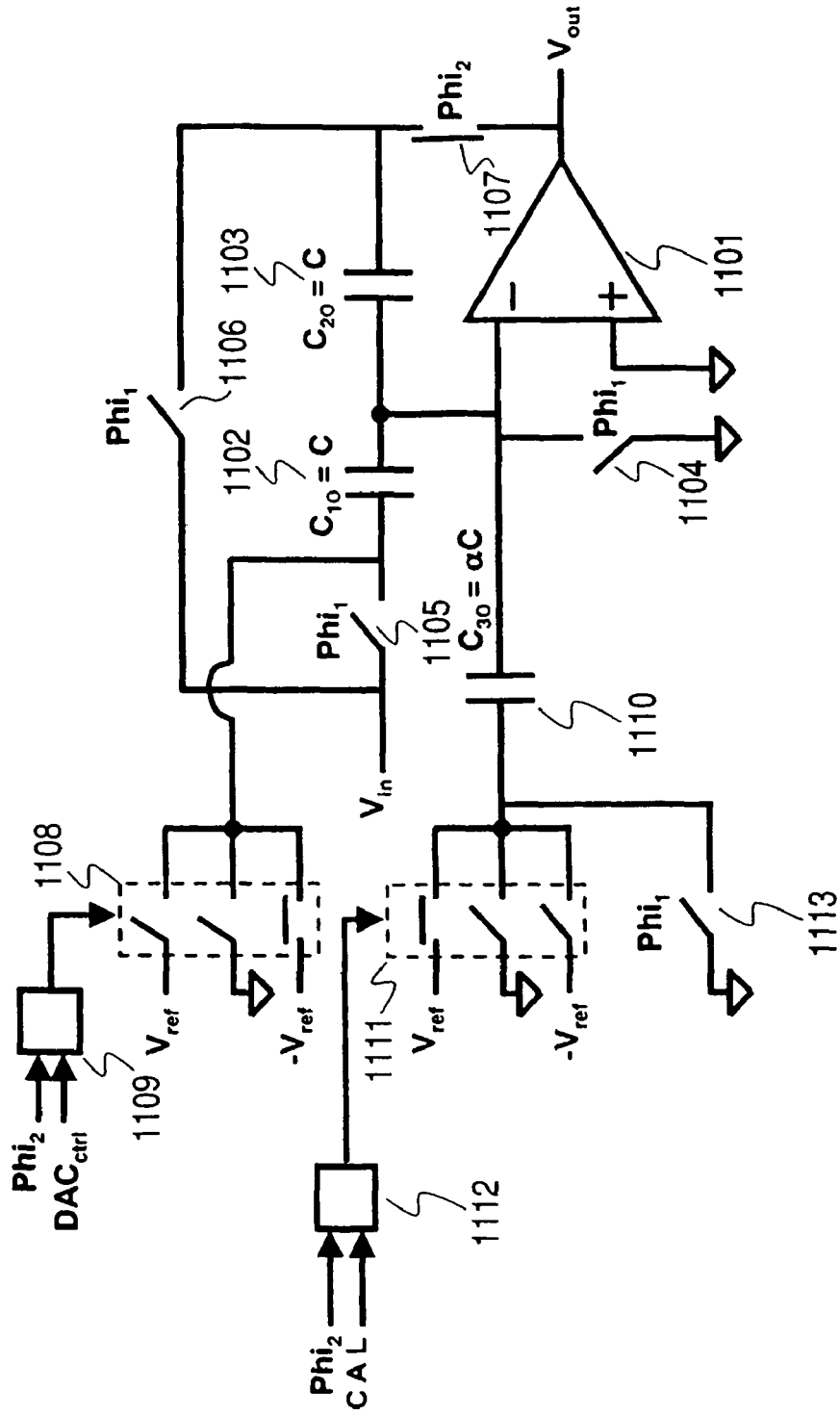
FIG. 16 is a diagram showing a configuration example (in an amp mode) of an MDAC circuit of a digital calibration type analog-to-digital converter according to the related art.

In FIG. 14, the configuration of the analog-to-digital converter and the digital calibration unit denoted by reference numeral 410 is the same as the second embodiment. Therefore, the respective MDACs, which configure the digital calibration of pipelined analog-to-digital converter is configured so that an op-amp is negatively fed back at the first capacitor $C_{10}$, the second capacitor $C_{20}$, and the third capacitor $C_{30}$. The third capacitor $C_{30}$ is configured such that the switch group control unit selects only one capacitive element unit from a capacitive bank configured by plural capacitive element units (an array of the capacitive element units is $C_{31}$ to $C_{3N}$) having substantially the same capacitance value.

A reception signal, which is input from an antenna through an input/output terminal, passes through the transmission and reception switching unit 401, and is amplified by the radio frequency circuit 402. Thereafter, the frequency thereof is converted into a lower intermediate frequency (or 0). An interference wave component of the intermediate frequency signal is removed by the filter 403, and then the intermediate frequency signal is amplified by the variable gain amplifier 404 to be input to the analog-to-digital converter 405. An output of the analog-to-digital converter 405 is input to the digital calibration unit 406 to calibrate the conversion error included in the output of the analog-to-digital converter 405 and output. The automatic gain control unit 408 automatically determines the gain of the variable gain amplifier 404 on the basis of the output level of the digital calibration unit 406 such that the output of the amplifier is equal to or a little bit smaller than an input dynamic range of the analog-to-digital converter 405. The digital signal processor 407 performs necessary filtering, demodulation, upper layer process on the digital signal, which is calibrated by the digital calibration unit 406. The analog-to-digital converter 405 reduces the power consumption of an op-amp, etc. of the internal circuit to realize the low power consumption, and the conversion error caused thereby is calibrated by the digital calibration unit 406. Therefore, it is possible to realize the analog-to-digital converter with high resolution and high sample rate at the low power consumption.

Meanwhile, the wireless transmitter circuit 409 includes a digital-to-analog converter that converts the transmitting digital signal generated by the digital signal processor into an analog signal.

According to the fifth embodiment, some or all of capacitors in the analog-to-digital converter and the digital calibration unit are configured by a capacitive bank, which is configured by plural capacitive element units having substantially the same capacitance value. By selecting only one of capacitive element units from the plural capacitive element units with a substantially same probability, the influence of the variation in the capacitance of the capacitive element unit is reduced.

In addition, some or all of capacitive elements of analog-to-digital converter in the wireless transmitter circuit 409 are configured by a capacitive bank, which is configured by plural capacitive element units having substantially the same capacitance value. By selecting only one of capacitive element units from the plural capacitive element units with a substantially same probability, the influence of the variation in the capacitance of the capacitive element unit is reduced.

According to the fifth embodiment, it is possible to reduce the influence of the variation in the specific accuracy of the capacitive elements with the simple circuit configuration and the control method without increasing the power consumption. As a result, since capacitive elements having small capacitance can be used for an analog-to-digital converter, the power consumption can be reduced.

According to the above described embodiments, various methods that make circuits including an analog-to-digital converter IC chips can be considered.

For example, it is possible to integrate a wireless receiver circuit including a radio frequency circuit, a low frequency circuit, an analog-to-digital converter, and a calibration unit on a single chip. It is further possible to integrate a wireless receiver circuit, a transmitter circuit, and a digital processor including a radio frequency circuit, a low frequency circuit, an analog-to-digital converter, and a calibration unit on a single chip.

What is claimed is:

1. An analog-to-digital converter comprising:
   an analog core unit having at least one capacitive element,
   wherein the capacitive element includes a capacitive bank having a plurality of capacitive element units having substantially the same capacitance value, and
   wherein the capacitive bank is configured to select one capacitive element unit from the plurality of capacitive element units with substantially equal probability.

2. The analog-to-digital converter according to claim 1, wherein the capacitive bank is configured to periodically select a specific capacitive element unit from the plurality of capacitive element units.

3. The analog-to-digital converter according to claim 1, wherein the capacitive bank is configured to randomly select a specific capacitive element unit from the plurality of capacitive element units.

4. The analog-to-digital converter according to claim 1, wherein the analog-to-digital converter is a digital calibration type analog-to-digital converter, and wherein the analog core unit is a digital calibration type multiplying digital-to-analog converter.

5. The analog-to-digital converter according to claim 1, wherein the analog-to-digital converter is a pipelined analog-to-digital converter, and wherein the analog core unit is individual stages of multiplying digital-to-analog converter.

6. The analog-to-digital converter according to claim 4, wherein the digital calibration type analog-to-digital converter is a digital calibration type pipelined analog-to-digital converter, and wherein the analog core unit is individual stages of digital calibration type multiplying digital-to-analog converter.

7. The analog-to-digital converter according to claim 1, wherein the analog-to-digital converter is a successive approximation analog-to-digital converter, and wherein the analog core unit is configured by a capacitive network.

8. The analog-to-digital converter according to claim 2, wherein the capacitive bank includes:
   a plurality of capacitive element units having substantially the same capacitance value;
   a plurality of element switches that turns on any one of the plurality of capacitive element units; and
   a switch group control unit that controls the plurality of element switches to be periodically turned on or off in synchronization with an operating clock.

9. The analog-to-digital converter according to claim 3, wherein the capacitive bank includes:
   a plurality of capacitive element units having substantially the same capacitance value;
   a plurality of element switches that turns on any one of the plurality of capacitive element units; and
   a switch group control unit that controls the plurality of element switches to be turned on or off in synchronization with an operating clock so as to randomly turn on any one of the plurality of capacitive element units with the equal probability.

10. The analog-to-digital converter according to claim 4, wherein the multiplying digital-to-analog converter has a configuration in which an op-amp is negatively fed back at a first capacitive element, a second capacitive element, and a third capacitive element that is connected to an inverting input terminal of the op-amp, and wherein the third capacitive element is configured such that a switch group control unit selects a specific capacitive element unit from the capacitive bank configured by the plurality of capacitive element units having substantially the same capacitance value.

11. The analog-to-digital converter according to claim 10, further comprising a digital calibration unit, wherein at least some capacitive elements in the multiplying analog-to-digital converter and the digital calibration unit are embodied by selecting a specific capacitive element unit from the capacitive bank configured by the plurality of capacitive element units having substantially the same capacitance value with substantially equal probability.

12. The analog-to-digital converter according to claim 11, wherein the switch group control unit includes a switch control unit to which a switch control signal synchronizing with an operating clock and a calibrating clock signal are input.

13. The analog-to-digital converter according to claim 5, wherein the multiplying digital-to-analog converter has a configuration in which an op-amp is negatively fed back at a first capacitive element and a second capacitive element, and wherein the first capacitive element and the second capacitive element are configured such that a switch group control unit selects a specific capacitive element unit from the capacitive bank configured by the plurality of capacitive element units having substantially the same capacitance value.

14. The analog-to-digital converter according to claim 1, wherein the capacitive bank includes:
   N (N is an integer equal to or larger than 1) capacitive element unit arrays $C_1$ to $C_N$;
   N element switch arrays including a pair of element switches connected to both terminals of each of the capacitive element units; and
   a switch group control unit that controls the element switches to be turned on or off on the basis of a switch control signal, and
   wherein the switch group control unit controls the switch control signal to make the frequencies when each of the element switches corresponding to each capacitive element unit is turned on substantially equal.

15. A wireless transceiver circuit, comprising:
   a wireless receiver circuit;
   a wireless transmitter circuit; and
   a transmission and reception switching unit,
   wherein the wireless receiver circuit includes:
   a radio frequency circuit;
   a low frequency circuit connected to an output of the radio frequency circuit;
   an analog-to-digital converter connected to an output of the low frequency circuit; and
   a calibration unit connected to the analog-to-digital converter,
   wherein the analog-to-digital converter and the calibration unit include an analog core unit having at least one capacitive element,
   wherein the capacitive element includes a capacitive bank having the plurality of capacitive element units having substantially the same capacitance value, and
   wherein the capacitive bank is configured to select one capacitive element unit from the plurality of capacitive element units with substantially equal probability.

16. The wireless transceiver circuit according to claim 15, wherein the capacitive bank is configured to periodically select a specific capacitive element unit from the plurality of capacitive element units.

17. The wireless transceiver circuit according to claim 15, wherein the capacitive bank is configured to randomly select a specific capacitive element unit from the plurality of capacitive element units.

18. The wireless transceiver circuit according to claim 15, wherein the wireless receiver circuit and the transmitter circuit including the radio frequency circuit, the low frequency circuit, the analog-to-digital converter, and the calibration unit are integrated on a single chip.

19. A control method of an analog-to-digital converter that includes a multiplying digital-to-analog converter, and at least some of capacitive elements of the multiplying digital-to-analog converter are embodied selecting a specific capacitive element unit from a capacitive bank configured by the plurality of capacitive element units having substantially the same capacitance value with substantially equal probability, the control method comprising steps of:
   performing a sample mode while selecting a specific one capacitive element unit from the capacitive bank with substantially equal probability; and
   performing an amp mode with respect to the specific capacitive element unit selected from the capacitive bank.

20. The control method according to claim 19, wherein the steps of performing of the sample mode and the amp mode are performed by an analog core unit that configures the analog-to-digital converter and a digital calibration unit, and includes at least one capacitive element configured by having a capacitive bank having a plurality of capacitive element units having substantially the same capacitance value, and wherein, in the steps of performing of the sample mode and the amp mode, the operation of selecting the specific capacitive element unit with substantially equal probability is performed in synchronization with an operating clock.

* * * * *